United States Patent
Ueno et al.

(12) 
(10) Patent No.: US 11,366,363 B2
(45) Date of Patent: Jun. 21, 2022

(54) ELECTRO-OPTICAL APPARATUS

(71) Applicant: Mitsubishi Electric Corporation, Tokyo (JP)

(72) Inventors: Takahiro Ueno, Kumamoto (JP); Toru Kiyohara, Tokyo (JP); Tomohiro Tashiro, Tokyo (JP)

(73) Assignee: Trivale Technologies, Santa Clara, CA (US)

( * ) Notice: Subject to any disclaimer, the term of this patent is extended or adjusted under 35 U.S.C. 154(b) by 0 days.

(21) Appl. No.: 17/206,939

(22) Filed: Mar. 19, 2021

(65) Prior Publication Data

US 2021/0208443 A1 Jul. 8, 2021

Related U.S. Application Data

(63) Continuation of application No. 16/419,158, filed on May 22, 2019, now Pat. No. 10,955,712.

(30) Foreign Application Priority Data

May 30, 2018 (JP) .............................. JP2018-103476

(51) Int. Cl.
  *G02F 1/1345* (2006.01)
  *H05K 1/14* (2006.01)
  (Continued)

(52) U.S. Cl.
  CPC .......... *G02F 1/13452* (2013.01); *G09F 9/301* (2013.01); *G09G 5/006* (2013.01);
  (Continued)

(58) Field of Classification Search
  CPC ......... H05K 2201/09063; H05K 1/028; H05K 1/0281; H05K 1/147; H05K 2201/2009; G02F 1/13452; G09F 9/301
  See application file for complete search history.

(56) References Cited

U.S. PATENT DOCUMENTS

| 2007/0134473 A1* | 6/2007 | Kim ..................... H05K 1/0281 |
| | | 428/209 |
| 2008/0088768 A1* | 4/2008 | Kohno ................ G02F 1/13452 |
| | | 349/60 |

(Continued)

FOREIGN PATENT DOCUMENTS

| CN | 203748103 U | 7/2014 |
| JP | 2000-148394 A | 5/2000 |

(Continued)

*Primary Examiner* — Jessica M Merlin
(74) *Attorney, Agent, or Firm* — Studebaker & Brackett PC

(57) ABSTRACT

An electro-optical apparatus includes an electro-optical panel having a first end portion, a first connector that is flexible, and a reinforcement member on the first connector. The first connector has a second end portion and a third end portion opposite to the second end portion. The second end portion is connected to the first end portion. The first connector has a first surface connected to the electro-optical panel, and a second surface opposite to the first surface. The reinforcement member is located on the first surface, and extends from an end surface at the first end portion of the electro-optical panel to the third end portion. The first connector has first and second side edges, at least one of which has a first cutout depressed inward. The first and second side edges connect the second and third end portions to each other.

15 Claims, 31 Drawing Sheets

(51) Int. Cl.
*H05K 1/02* (2006.01)
*H05K 3/22* (2006.01)
*G09G 5/00* (2006.01)
*H05K 3/36* (2006.01)
*G09F 9/30* (2006.01)

(52) U.S. Cl.
CPC ............ *H05K 1/0281* (2013.01); *H05K 1/14* (2013.01); *H05K 3/22* (2013.01); *H05K 3/361* (2013.01); *H05K 2201/2009* (2013.01)

(56) References Cited

U.S. PATENT DOCUMENTS

| | | | |
|---|---|---|---|
| 2016/0299386 A1* | 10/2016 | Ueno | G02F 1/13452 |
| 2016/0322724 A1 | 11/2016 | Lee et al. | |
| 2017/0160826 A1 | 6/2017 | Nakase | |

FOREIGN PATENT DOCUMENTS

| JP | 2001242479 A | * | 9/2001 |
|---|---|---|---|
| JP | 2001242479 A | | 9/2001 |
| JP | 2003-243791 A | | 8/2003 |
| JP | 2004-235321 A | | 8/2004 |
| JP | 2007292838 A | | 11/2007 |
| JP | 2008-96866 A | | 4/2008 |
| JP | 2008098548 A | | 4/2008 |
| JP | 2008-135465 A | | 6/2008 |
| JP | 2012-83492 A | | 4/2012 |
| JP | 2016-200728 A | | 12/2016 |

\* cited by examiner

F I G. 4 2
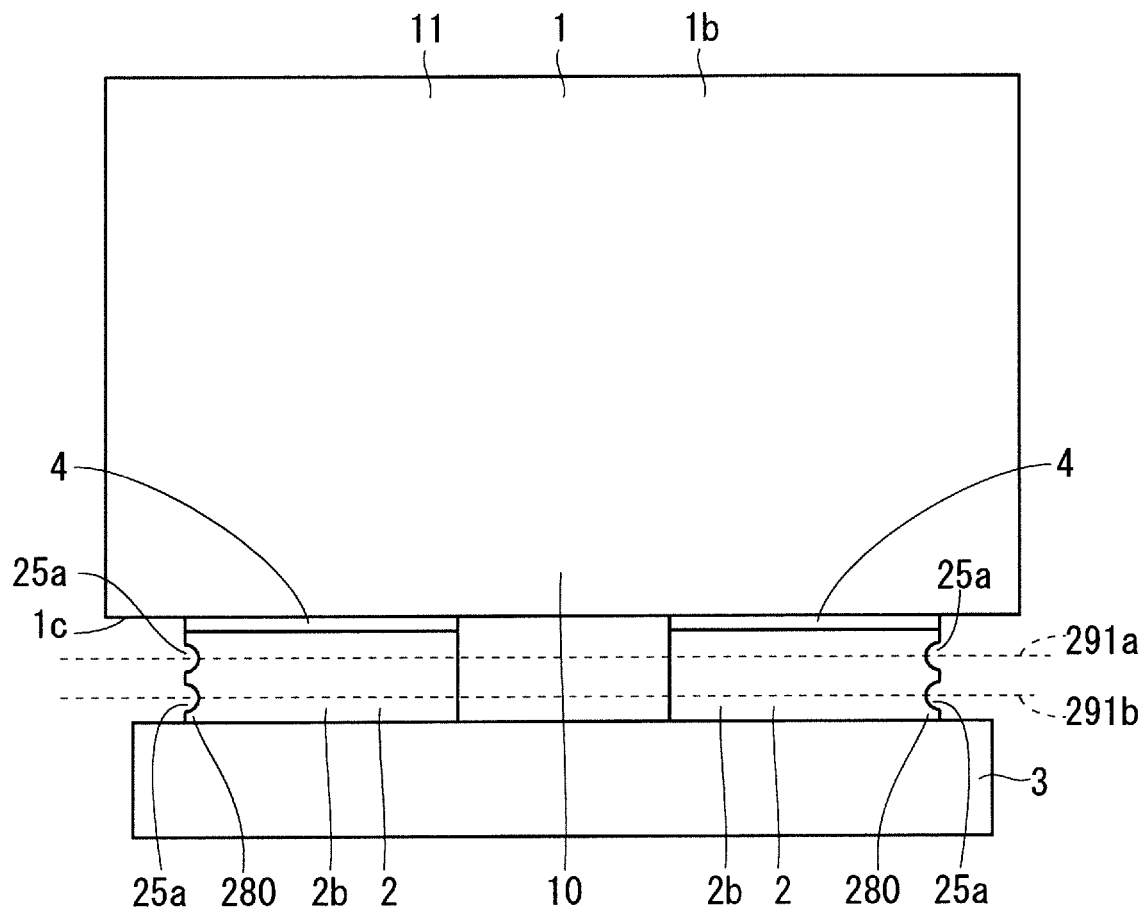

F I G. 4 3
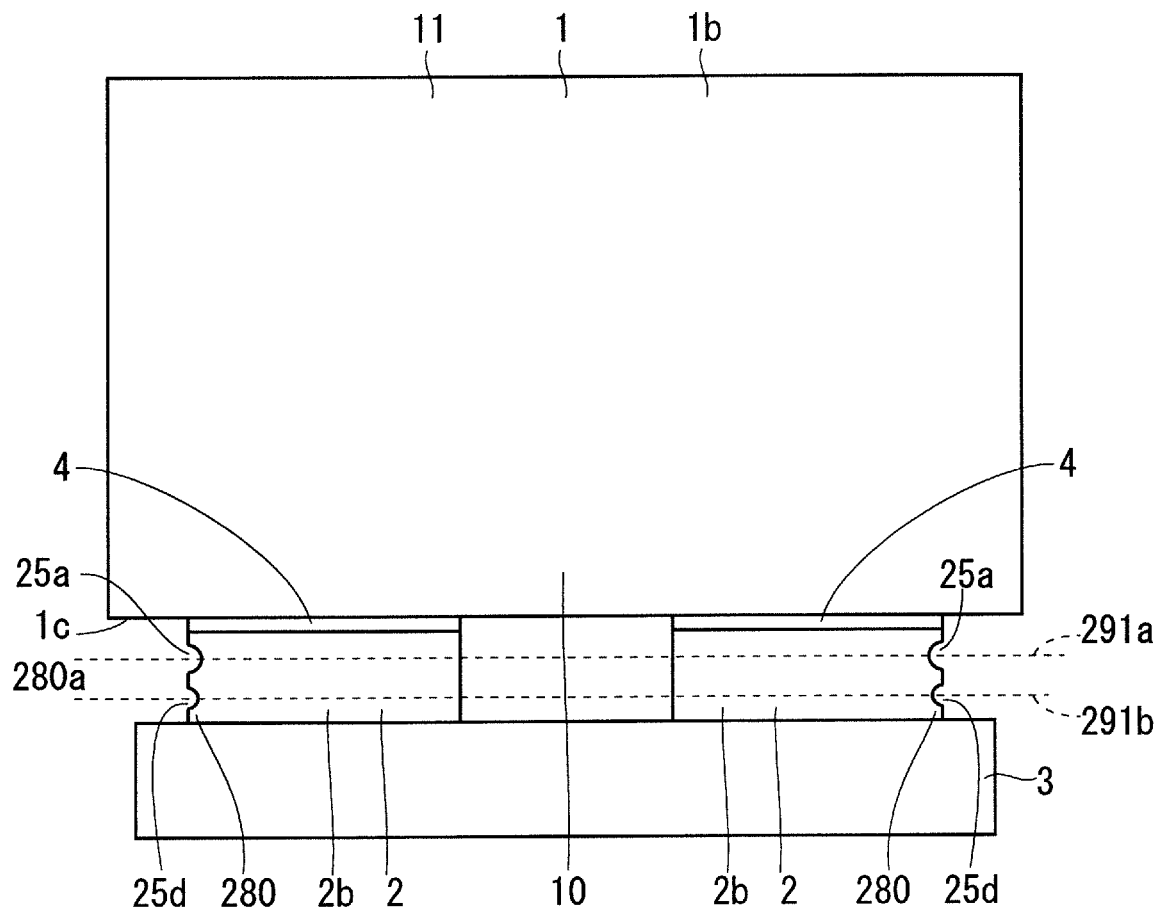

ELECTRO-OPTICAL APPARATUS

CROSS REFERENCE TO RELATED APPLICATIONS

This application is a Continuation of U.S. patent application Ser. No. 16/419,158 filed on May 22, 2019, which claims benefit of priority to Japanese Patent Application No. 2018-103476 filed May 30, 2018, the entire content of which is incorporated herein by reference.

BACKGROUND OF THE INVENTION

Field of the Invention

The present invention relates to electro-optical apparatuses.

Description of the Background Art

Techniques about electro-optical apparatuses are disclosed in Japanese Patent Application Laid-Open No. 2008-98548, Japanese Patent Application Laid-Open No. 2007-292838, and Japanese Patent Application Laid-Open No. 2001-242479. Such an electro-optical apparatus includes an electro-optical panel (e.g., liquid-crystal display panel) and a flexible connector connected to the electro-optical panel.

The uses of the electro-optical apparatuses, such as liquid crystal displays, are being increasingly diversified nowadays; the electro-optical apparatuses can be used in various environments. As such, the electro-optical apparatus can be under stress at the joint between the electro-optical panel and the connector, thus possibly suffering damage to the connector, breakage in the connector, or detachment of the connector from the electro-optical panel.

SUMMARY

To solve these problems, it is an object of the present invention to provide a technique for reducing a stress generated at the joint between an electro-optical panel and a connector.

An aspect provides an electro-optical apparatus that includes the following: an electro-optical panel having a first end portion; a first connector that is flexible, the first connector having a second end portion and a third end portion opposite to the second end portion, the second end portion being connected to the first end portion; and a reinforcement member on the first connector. The first connector has a first surface connected to the electro-optical panel, and a second surface opposite to the first surface. The reinforcement member is located on the first surface, and extends from an end surface at the first end portion of the electro-optical panel to the third end portion. The first connector has first and second side edges, at least one of which has a first cutout depressed inward, the first and second side edges connecting the second and third end portions to each other.

Such a configuration reduces the stress generated at the joint between the electro-optical panel and the connector.

These and other objects, features, aspects and advantages of the present invention will become more apparent from the following detailed description of the present invention when taken in conjoint with the accompanying drawings.

BRIEF DESCRIPTION OF THE DRAWINGS

FIGS. 42 and 43 are plan views each illustrating one example of the configuration of the electro-optical apparatus.

DESCRIPTION OF THE PREFERRED EMBODIMENTS

First Preferred Embodiment

Figure 1:
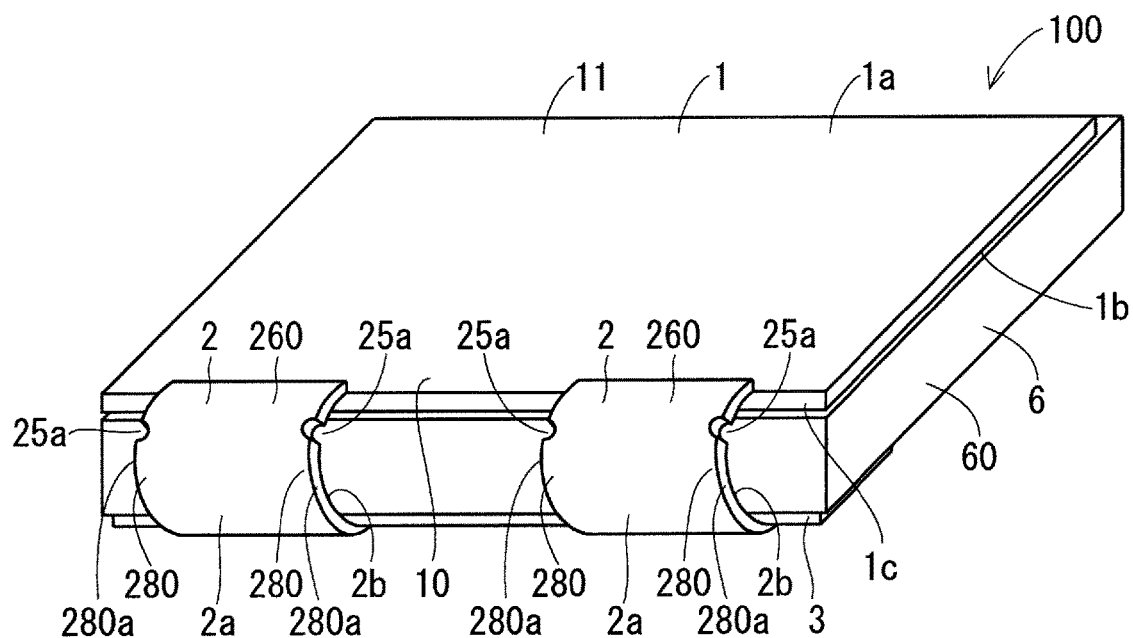
FIGS. 1 and 2 are perspective views each illustrating one example of the configuration of an electro-optical apparatus.
Figure 2:
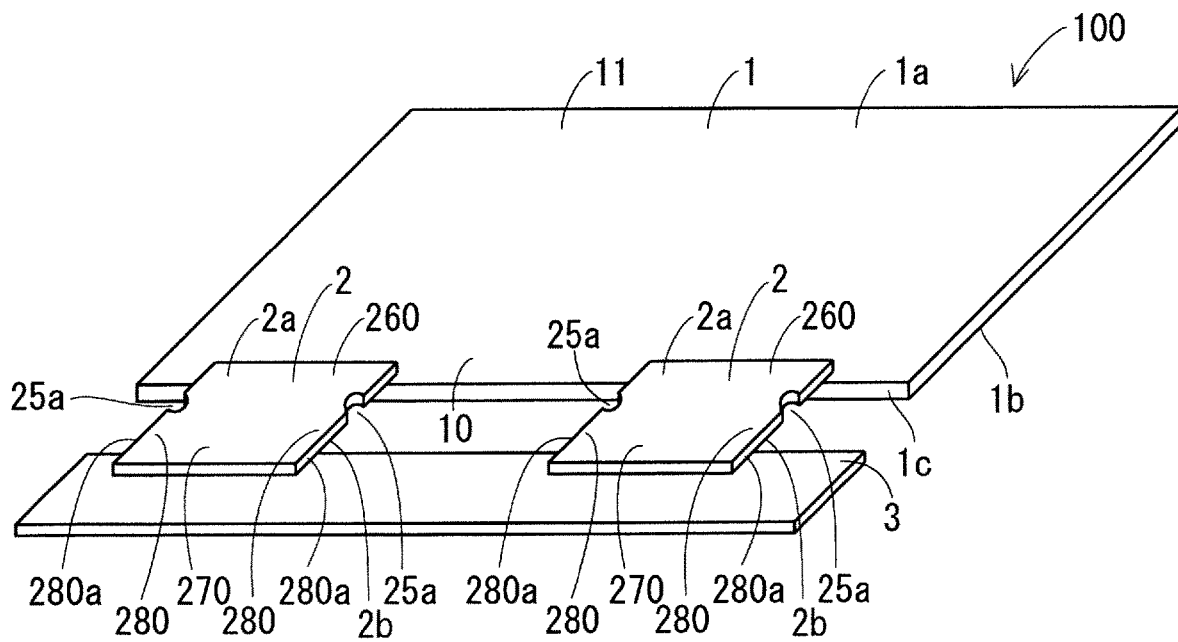
Figure 3:
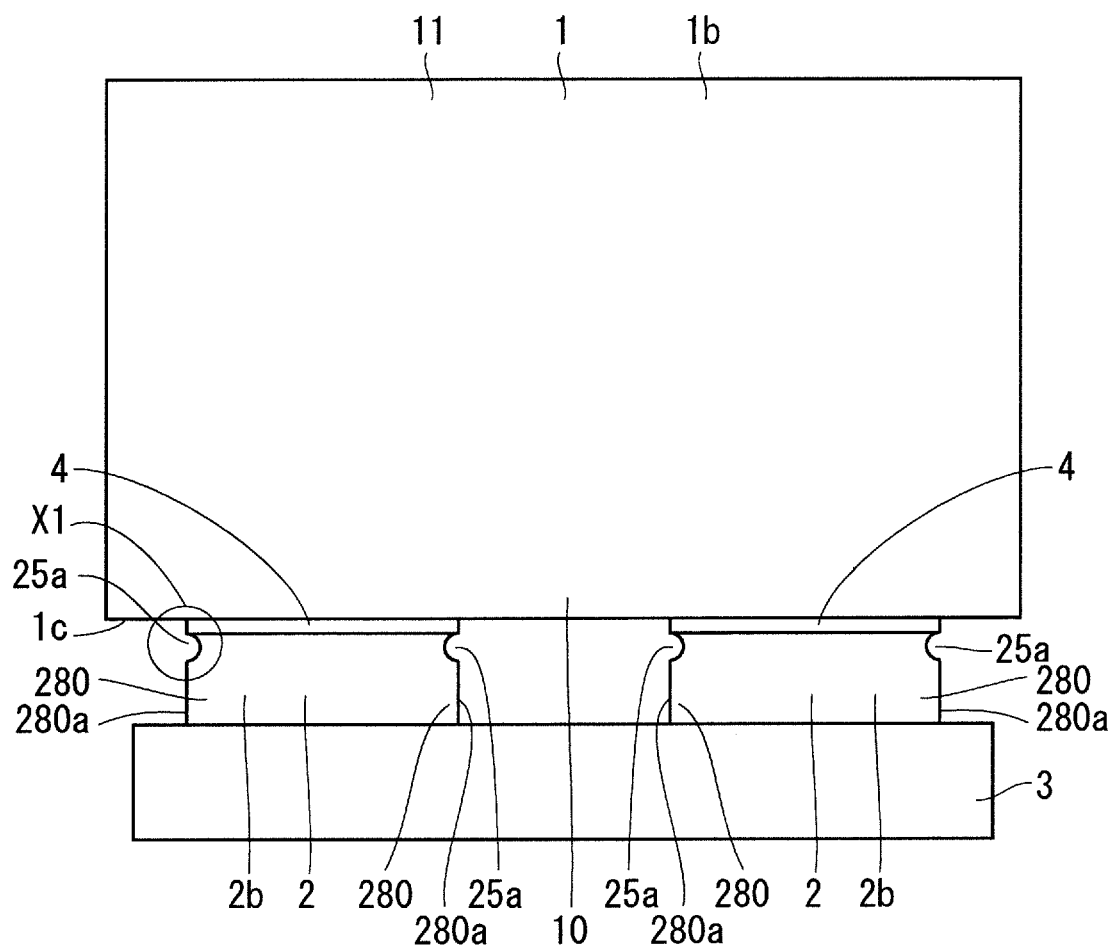
FIG. 3 is a plan view illustrating one example of the configuration of the electro-optical apparatus.
Figure 4:
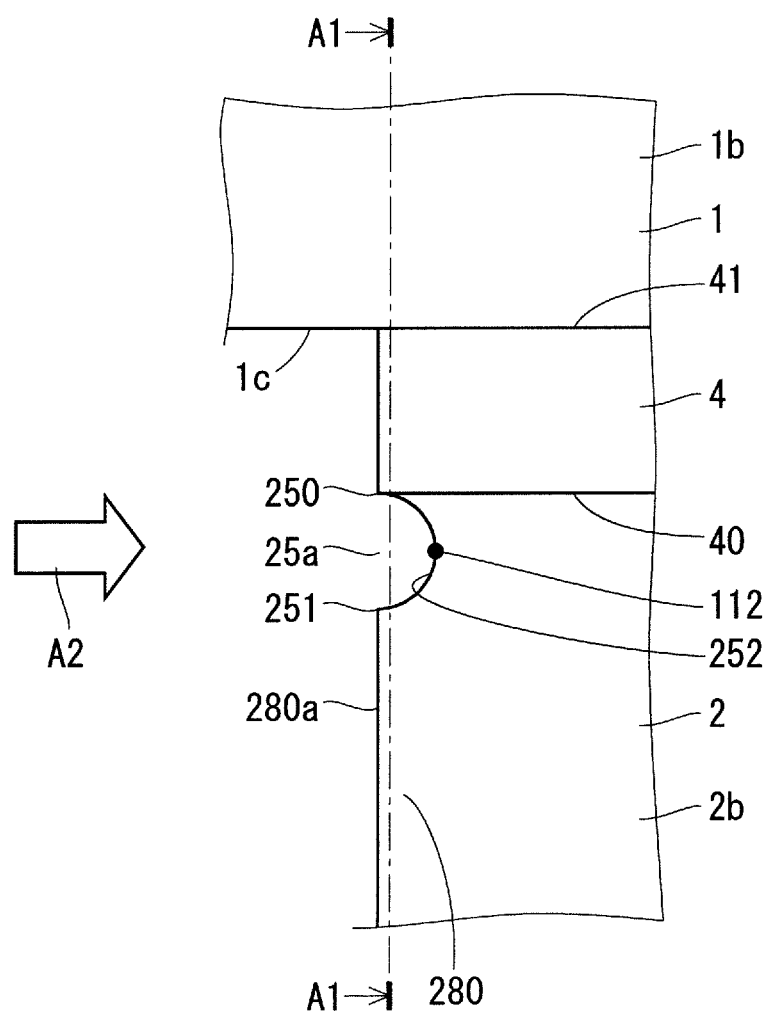
FIG. 4 is an enlarged view illustrating one example of the configuration of the electro-optical apparatus.
Figure 5:
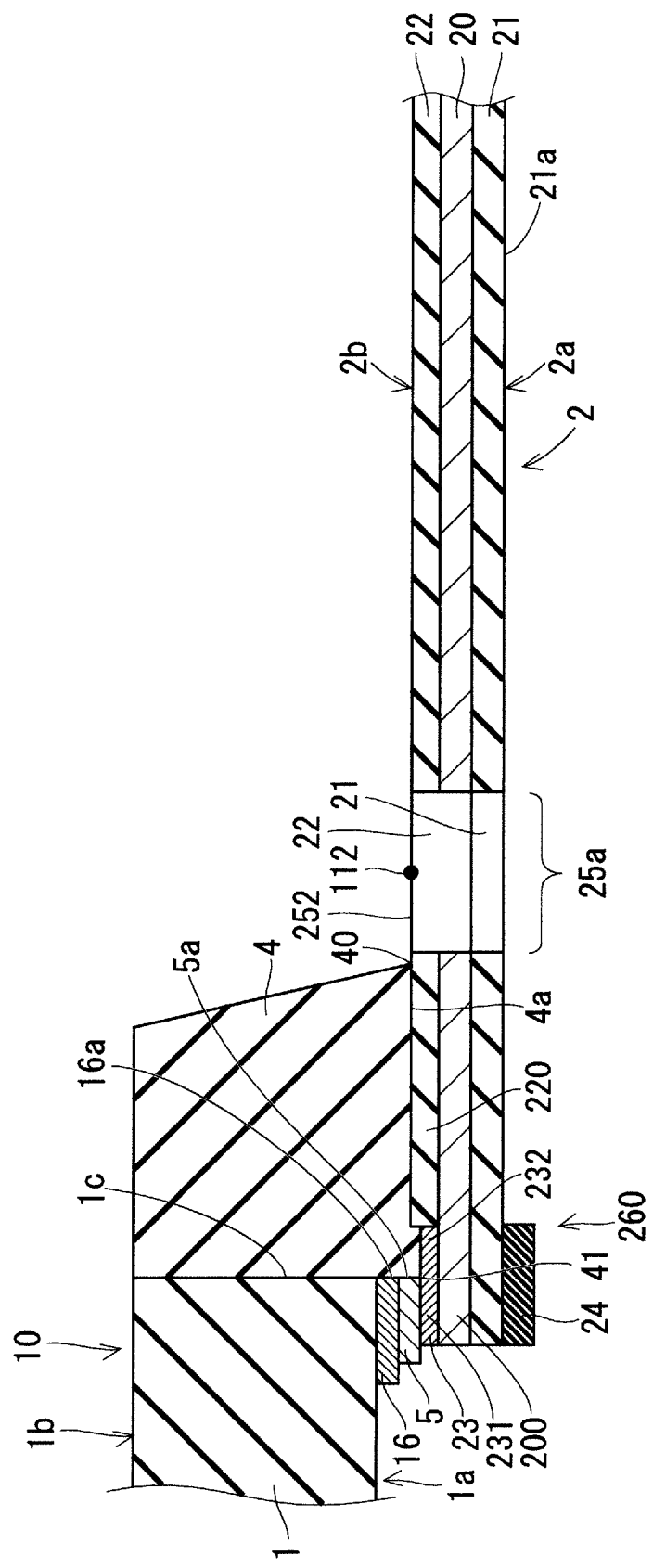
FIG. 5 is a cross-sectional view illustrating one example of the configuration of the electro-optical apparatus.
Figure 6:
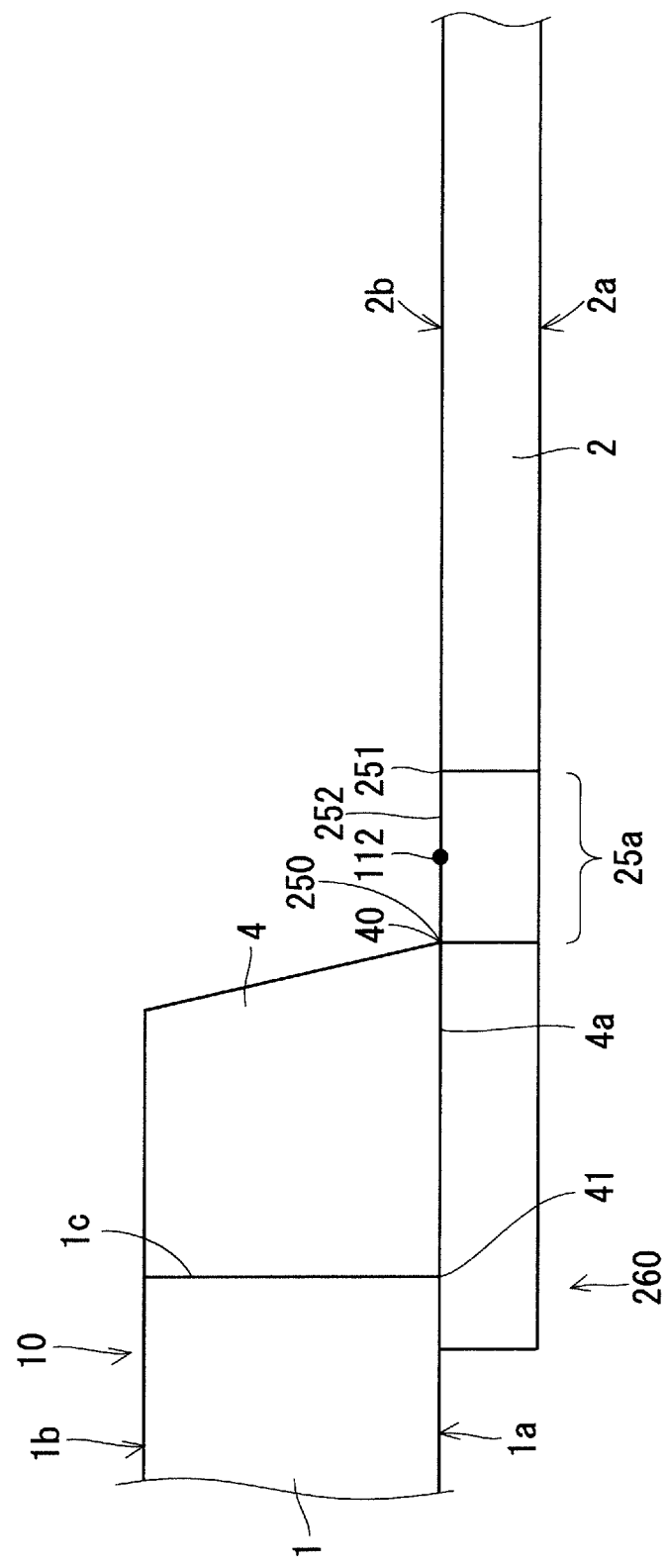
FIG. 6 is a side view illustrating one example of the configuration of the electro-optical apparatus.

FIG. 1 is a perspective view illustrating one example of the configuration of an electro-optical apparatus 100 according to a first preferred embodiment. FIG. 2 is a perspective view illustrating one example of the configuration of part of the electro-optical apparatus 100 in FIG. 1. FIG. 3 is a plan view illustrating the same. FIG. 4 is an enlarged view of a portion X1 in FIG. 3. FIG. 5 is a cross-sectional view taken along line A1-A1 in the structure in FIG. 4. FIG. 6 is a diagram illustrating the structure in FIG. 4 as viewed from arrow A2. The cross-sectional view in FIG. 5 is illustrated with hatching. Cross-sectional views in the subsequent drawings are also illustrated with hatching.

FIG. 2 shows an electro-optical panel 1, connectors 2, and a circuit board 3, all of which are included in the electro-optical apparatus 100. FIG. 3 shows the electro-optical panel 1, the connectors 2, the circuit board 3, and reinforcement members 4, all of which are included in the electro-optical apparatus 100. As illustrated in FIG. 1, the electro-optical apparatus 100 is used with the connectors 2 bent. FIGS. 2 to 6 show the connector 2 before bent. The structure of the electro-optical panel 1 and the connector 2 in FIG. 6 is simpler than that in FIG. 5.

An example of the electro-optical apparatus 100 is a display that displays an image. To be specific, the electro-optical apparatus 100 is a liquid crystal display for instance. The electro-optical apparatus 100 may be any apparatus other than a display.

As illustrated in FIGS. 1 to 6, the electro-optical apparatus 100 includes the electro-optical panel 1, the flexible connectors 2, the circuit board 3, the reinforcement members 4, and a backlight 6. The electro-optical apparatus 100, although including two connectors 2 in the preferred embodiment, may include one connector 2 or include three or more connectors 2.

An example of the electro-optical panel 1 is a display panel that displays an image. To be specific, the electro-optical panel 1 is a liquid-crystal display panel for instance. The electro-optical panel 1 includes a substrate made of glass, plastic or other materials, and a terminal electrode 16 (c.f., FIG. 5) on the substrate. The terminal electrode 16 is made of a conductive material. The electro-optical panel 1 is a substantially rectangular plate. The electro-optical panel 1 has a main surface 1a that is connected to the connectors 2 and includes a display surface, and the electro-optical panel 1 also has a main surface 1b opposite to the main surface 1a. The electro-optical panel 1 has, in its shorter-side direction, an end portion 10 connected to the connectors 2, and an end 11 opposite to the end portion 10. As illustrated in FIG. 5, the terminal electrode 16 is located on the main surface 1a at the end portion 10. For convenience of description, the main surface 1a is hereinafter also referred to as a front surface 1a; and the main surface 1b, as a back surface 1b.

The electro-optical panel 1 may be any panel other than a liquid-crystal display panel. For instance, the electro-optical panel 1 may be a touch panel having a display function and a function of detecting a user operation. This touch panel may be an in-cell touch panel or an on-cell touch panel. Hereinafter, the electro-optical panel 1 is also just referred to as a panel 1.

An example of the circuit board 3 is a printed circuit board. A printed circuit board is also called a printed board or a rigid board. The circuit board 3 includes a substrate made of epoxy resin or phenolic plastic, and components on the substrate. The circuit board 3 outputs a signal or other things to the electro-optical panel 1. Hereinafter, the circuit board 3 is also just referred to as a board 3.

The connectors 2 each electrically connect the panel 1 and the board 3 to each other. An example of each connector 2 is a flexible printed circuit (FPC). The connectors 2 are also considered to be wires. At least one of the plurality of connectors 2 may be provided with a component or with no components. A technique of mounting components on a flexible printed circuit is called chip-on-film (COF). The connectors 2 are each a film. The connectors 2 each have a main surface 2a and a main surface 2b opposite to the main surface 2a. The panel 1 is connected to the main surfaces 2b. For convenience of description, the main surface 2a is hereinafter also referred to as a front surface 2a; and the main surface 2b, as a back surface 2b.

Referring to FIG. 2, the connectors 2 each have a panel-side end portion 260 connected to the panel 1, and a board-side end portion 270 opposite to the panel-side end portion 260 and connected to the board 3. The panel-side ends 260 are connected to the end portion 10 of the panel 1. The signal or other things output from the board 3 is input to the panel 1 via the connectors 2. The board 3 outputs, for instance, a signal for driving the panel 1. Hereinafter, a direction in which the panel-side end portion 260 and the board-side end portion 270 are connected together is also referred to as a length direction. Hereinafter, a direction perpendicular to the thickness direction and length direction of the connectors 2 is also referred to as a width direction.

As illustrated in FIG. 5, the connectors 2 each include a base film 21, a conductor 20 adhering to the base film 21, a terminal electrode 23 on the conductor 20, a cover lay 22 disposed over the base film 21 to cover the conductor 20, and a reinforcement member 24. The conductor 20 and the terminal electrode 23 function as wires. The base film 21 and the cover lay 22 are made of an insulating material. The base film 21 is located on the front surface 2a, and the cover lay 22 is located on the back surface 2b.

The reinforcement member 24 is used to reinforce the joint between the connector 2 and the panel 1. The reinforcement member 24 is located at the panel-side end portion 260 of the connector 2. The reinforcement member 24 is located on a main surface 21a of the base film 21 on the front surface 2a. The reinforcement member 24 is made of the same material as that of the cover lay 22, for instance. It is noted that the reinforcement member 24 may be made of a material different from that of the cover lay 22.

The conductor 20 of the connector 2 has an end portion 200 at the panel-side end portion 260. The end portion 200 is not covered with the cover lay 22. The terminal electrode 23 is located on the end portion 200 of the conductor 20, and is not covered with the cover lay 22. The terminal electrode 23 is located on the back surface 2b and at the panel-side end portion 260.

The terminal electrode 23 of the connector 2 is connected to the terminal electrode 16 of the panel 1 with a conductive adhesive 5. The connector 2 and the panel 1 are thus electrically connected to each other. The electro-optical apparatus 100 may include one terminal electrode 16 and one terminal electrode 23 connected to the terminal electrode 16. Alternatively, the electro-optical apparatus 100 may include a plurality of terminal electrodes 16 and a plurality of terminal electrodes 23 connected to the respective terminal electrodes 16.

As illustrated in FIG. 1, the connectors 2 of the electro-optical apparatus 100 are each bent with the front surface 2a being oriented outward, so that the back surface 1b of the panel 1 faces the board 3 via the backlight 6. In this example, the connectors 2 are each curved. The backlight 6 includes a casing 60 containing a light source and other components. The panel 1 and the board 3 are attached to the casing 60. The panel 1 is irradiated with light from the backlight 6 to display an image on the front surface 1a of the panel 1.

The reinforcement member 24 is used to reinforce the joint between the connector 2 and the panel 1. The reinforcement member 24 is located on the back surface 2b of each connector 2. The reinforcement members 4 are each made of an insulating material. The reinforcement members 4 each may be made of an adhesive material, such as resin, or of a material that hardens in reaction to temperature, light, or other things. Alternatively, the reinforcement members 4 each may be made of a material that hardens upon volatilization of a solvent contained in the material. Alternatively, the reinforcement members 4 each may be made of a moisture-reactive material.

As illustrated in FIGS. 5 and 6, the reinforcement member 4 extends from an end surface 1c at the end portion 10 of the panel 1 (i.e., the side surface of the panel 1) to the board-side end portion 270 of the connector 2, that is, to the board 3 along the length direction of the connector 2. The end surface 1c of the panel 1 includes an end surface 16a of the terminal electrode 16 adjacent to the reinforcement member 4. As illustrated in FIG. 3, the reinforcement members 4 each extend along the width direction of the connector 2. To be specific, the reinforcement members 4 each extend from one of the ends of the connector 2 to the other end in the width direction.

As illustrated in FIG. 5, the terminal electrode 23 of the connector 2 has a first portion 231 connected to the terminal electrode 16 with the conductive adhesive 5, and has a second portion 232 exposed from the conductive adhesive 5 and the cover lay 22 without being connected to the terminal electrode 16. The second portion 232 is located closer to the board 3 than the first portion 231. The reinforcement member 4 covers the second portion 232. In this way, the reinforcement member 4 covers the second portion 232, exposed from the conductive adhesive 5 and the cover lay 22, to protect the terminal electrode 23.

The reinforcement member 4 also covers an end portion 220 of the cover lay 22 at the panel-side end portion 260. The reinforcement member 4 also covers part of the end surface 1c of the panel 1 and covers an end surface 5a of the conductive adhesive 5 adjacent to the reinforcement member 4.

As described above, each reinforcement member 4 in the electro-optical device 100 allows the terminal electrode 23 of the connector 2 to remain unexposed at the second portion 232, and allows the panel-side end portion 260 of the connector 2 to be resistant to bending. This reduces possible damage to the terminal electrode 23 or possible breakage in the terminal electrode 23. This also reduces possible detachment of the terminal electrode 23 of the connector 2 from the terminal electrode 16 of the panel 1. In addition, when the electro-optical apparatus 100 with each connector 2 bent receives a vibration or an impact, the connector 2 contacts the end surface 1c of the panel 1. This reduces possible damage to the connector 2 or possible breakage in the connector 2.

In this example, each connector 2 has cutouts 25a. To be specific, the connector 2 has side edges 280 each provided with the cutout 25a. The side edges 280 connect the panel-side end portion 260 and the board-side end portion 270 together. In this example, the cutout 25a is provided for each of the pair of side edges 280 extending in the length direction of the connector 2.

Each cutout 25a is depressed inward from an end surface (i.e., side surface) 280a of the side edge 280. The cutout 25a extends from the front surface 2a to the back surface 2b, at the side edge 280 so as to avoid the conductor 20. As illustrated in FIG. 1, the cutouts 25a are each located at a portion where the connector 2 is bent. The cutout 25a is semicircular for instance. To be specific, the cutout 25a is semicircular when viewed from the front surface 2a or the back surface 2b.

Reference is made to FIGS. 4 and 6. The cutout 25a has an end 250 at its edge 252 on the back surface 2b, the end 250 being located at the panel-side end portion 260. The reinforcement member 4 has an end 41a on its connection surface 4a that is in contact with the main surface 2b, the end 41a being located at the panel-side end portion 260. The end 250 is located closer to the board-side end portion 270 than the end 41. The end 250 of the cutout 25a is located to coincide with an end 40 of the reinforcement member 4, or is located closer to the board-side end portion 270 than the end 40 of the connection surface 4a of the reinforcement member 4, the end 40 being located at the board-side end portion 270. The cutout 25a has an end 251 at the edge 252, the end 251 being adjacent to the board 3. The end 251 is located closer to the board 3 than the end 40 of the connection surface 4a of the reinforcement member 4, the end 40 being adjacent to the board 3. In this example, since the reinforcement member 4 is in contact with the back surface 2b, the connection surface 4a is also considered to be a surface of the reinforcement member 4 that is in contact with the main surface 2b.

In this example, the position of the end 250 of the cutout 25a in the length direction of the connector 2 coincides with the position of the end 40 of the reinforcement member 4 in the length direction of the connector 2. When viewed from the back surface 2b, the cutout 25a seems to extend from the end 40 of the reinforcement member 4 in the length direction of the connector 2. When viewed from the back surface 2b, the cutout 25a is located in a position that does not overlap the reinforcement member 4.

As described above, in the electro-optical apparatus 100, the connectors 2, which are provided with the reinforcement members 4 and have the cutouts 25a, tend to be under stress around the cutouts 25a.

For instance, when the cutouts 25a are each located at a portion where the connector 2 is bent, as indicated in this example, the connector 2 as bent tends to be under stress around the cutout 25a. To be specific, the connector 2 tends to exhibit stress concentration at a site 112 illustrated in FIGS. 4 to 6, and thus tends to be under stress around the site 112. The site 112 is the innermost position at the edge 252 of the cutout 25a on the back surface 2b. In other words, the site 112 is the closest to a centerline extending in the length direction of the connector 2, in the edge 252 of the cutout 25a on the back surface 2b.

Figure 7:
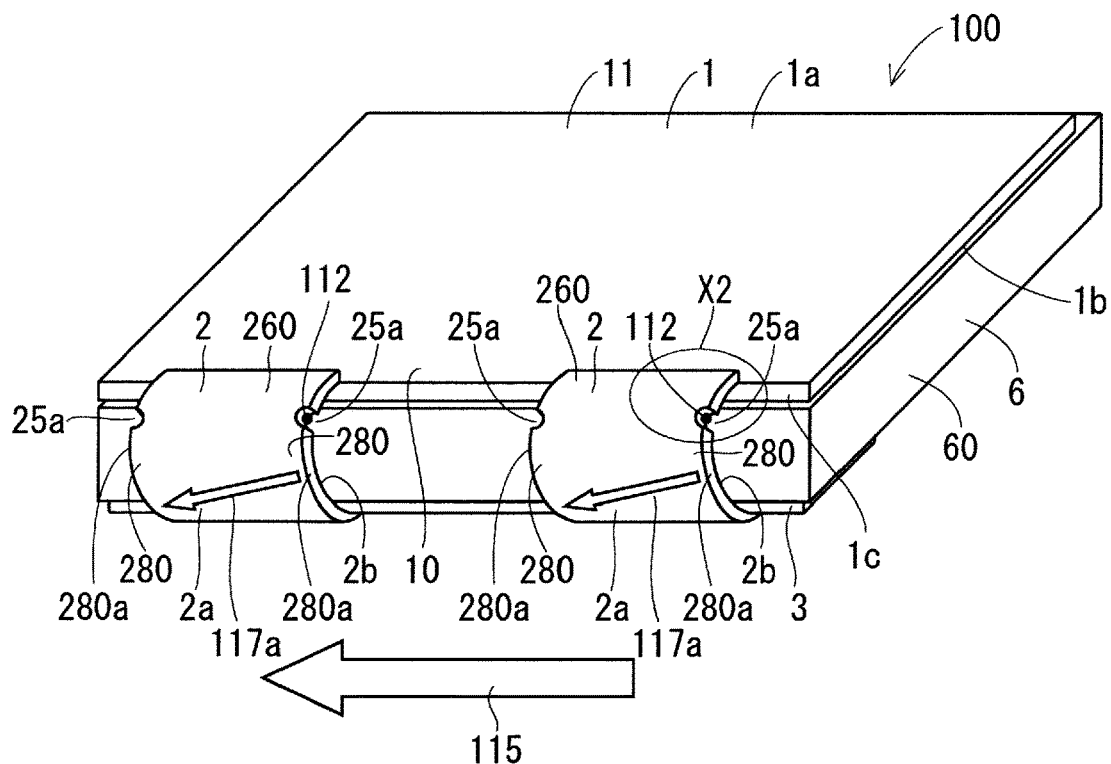
FIG. 7 is a diagram illustrating one example of force applied to the electro-optical apparatus.
Figure 8:
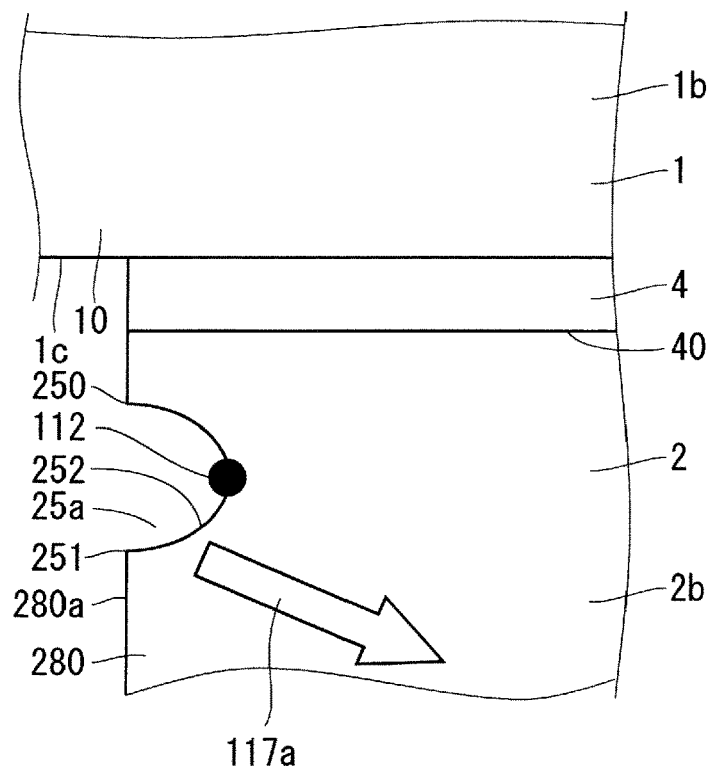
FIG. 8 is a diagram illustrating one example of stress generated in the electro-optical apparatus.

The periphery of the site 112 also tends to be under stress generated by, for instance, friction or vibration resulting from an external force. Take FIG. 7 as an example, where friction or vibration resulting from an external force generates a force 115 by which the circuit board 3 moves to the left on the drawing sheet. FIG. 8 is an enlarged plan view of a portion X2 in FIG. 7 when viewed from the back surface 2b of the connector 2. Unlike the example in FIG. 4, the example in FIG. 8 shows that the end 250 at the edge 252 of the cutout 25a, the end 250 being adjacent to panel 1, is located closer to the board 3 than the end 40 of the connection surface 4a of the reinforcement member 4, the end 40 being adjacent to the board 3. This holds true for the example in FIG. 10, which will be described later on. The connector 2 receives a stress 117a generated by the force 115. The stress 117a tends to be applied around the site 112.

Figure 9:
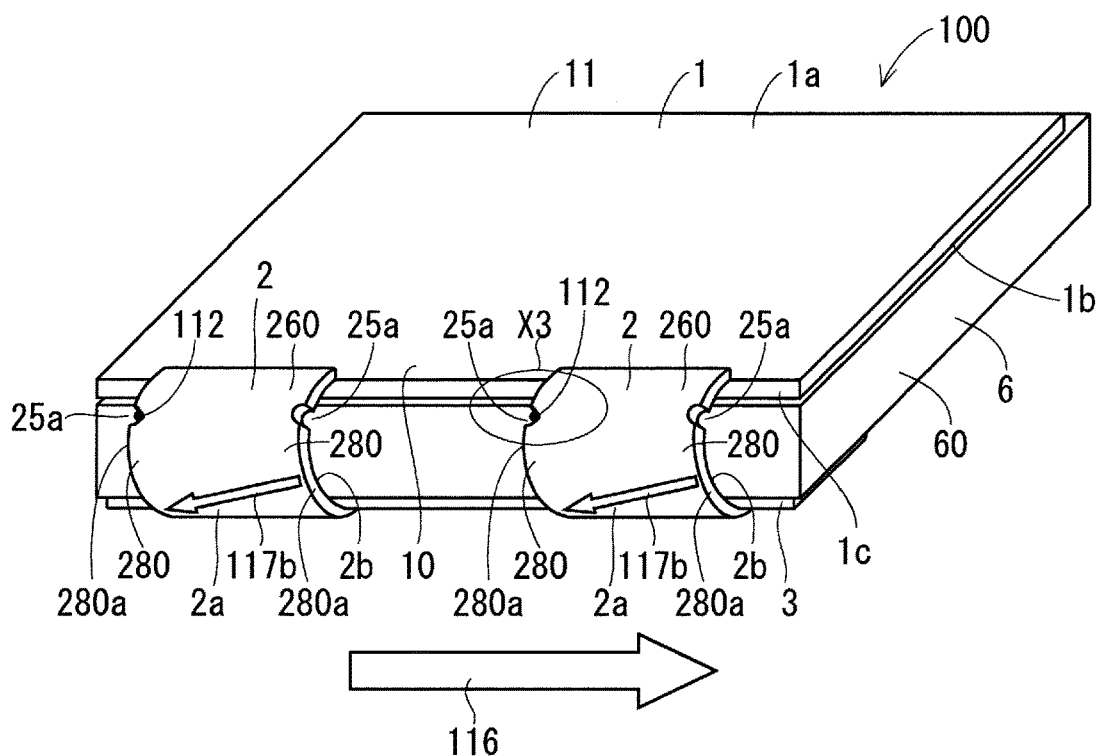
FIG. 9 is a diagram illustrating one example of the force applied to the electro-optical apparatus.
Figure 10:
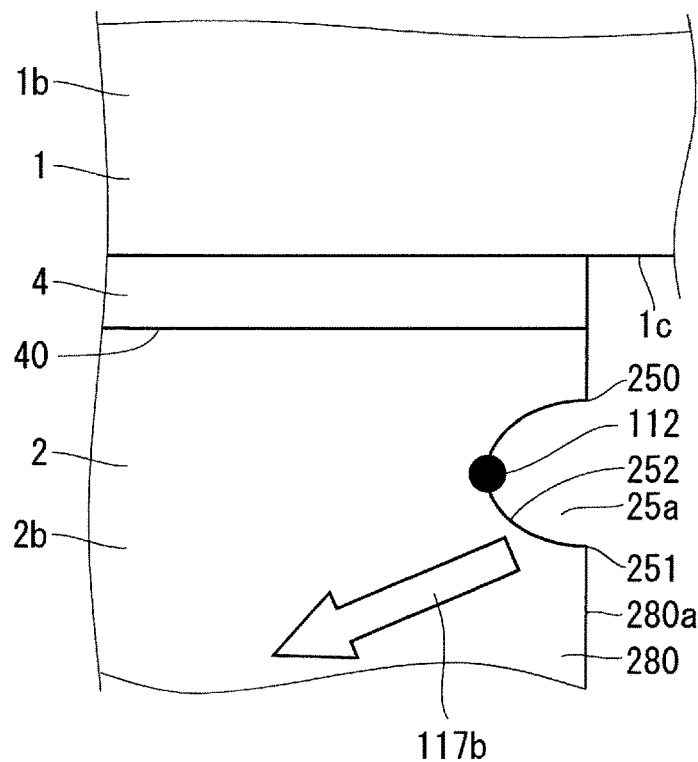
FIGS. 10 to 12 are diagrams each illustrating one example of the stress generated in the electro-optical apparatus.

Take FIG. 9 as another example, where friction or vibration resulting from an external force generates a force 116 by which the circuit board 3 moves to the right on the drawing sheet. FIG. 10 is an enlarged plan view of a portion X3 in FIG. 9 when viewed from the back surface 2b of the connector 2. The connector 2 receives a stress 117b generated by the force 116. The stress 117b tends to be applied around the site 112.

Figure 11:
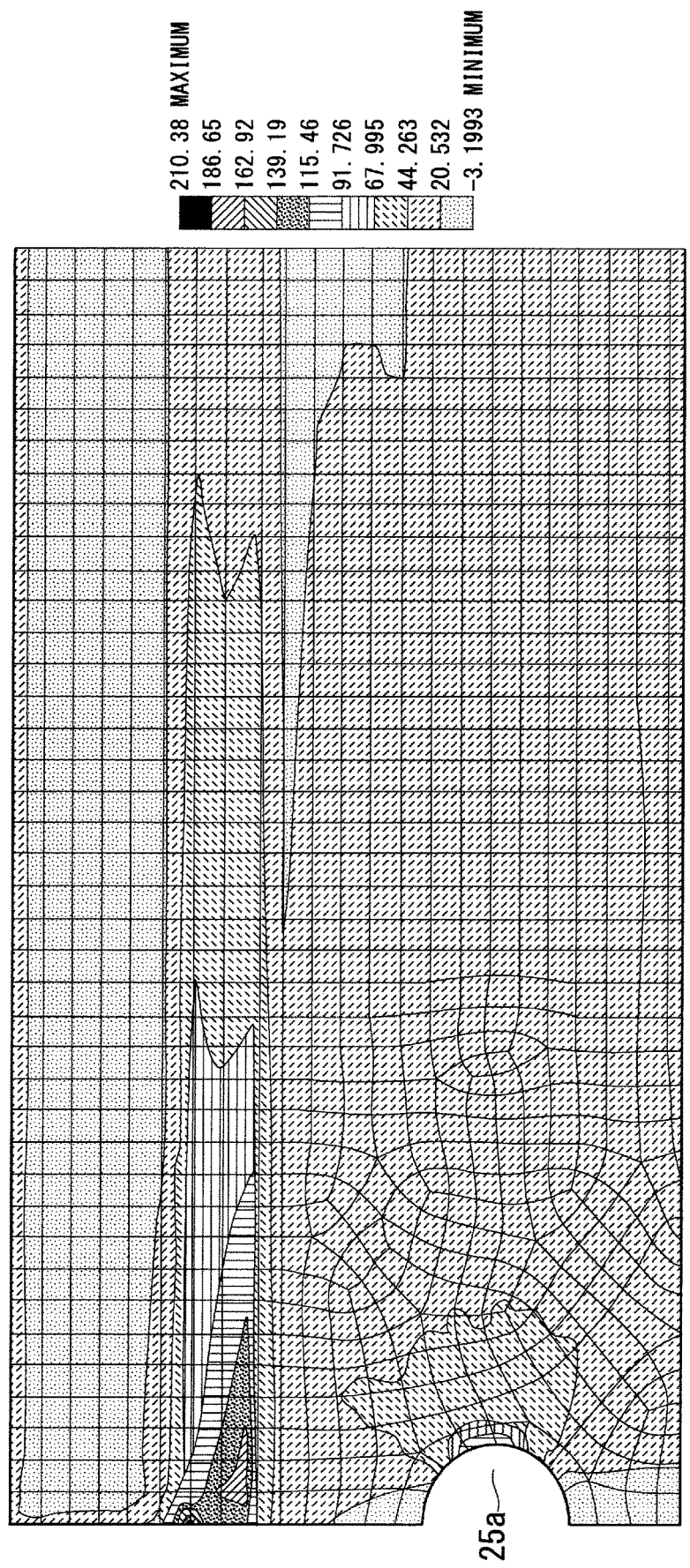
Figure 12:
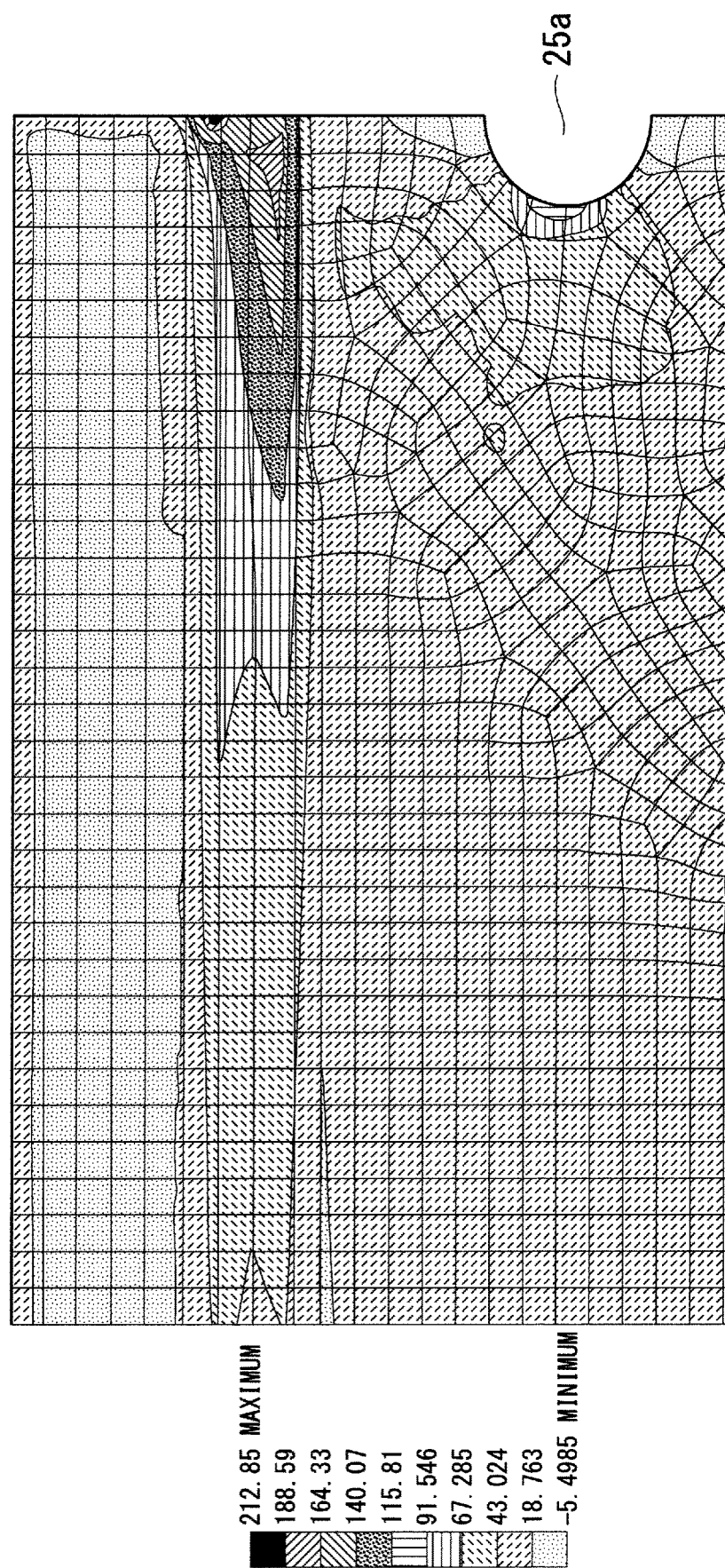

Not only an external stress, but also an internal stress tends to be applied around the site 112, where stress concentration tends to occur. FIGS. 11 and 12 are diagrams each illustrating a simulation result showing thermal stress and distortion that are generated in the connector 2 when the temperature around the electro-optical apparatus 100 is raised from room temperature to a temperature higher than the room temperature by +215° C. When the temperature around the electro-optical apparatus 100 is raised, a thermal stress generates an internal stress that expands and contracts the connector 2. The simulation result in FIG. 11 is about the structure in FIG. 8. The simulation result in FIG. 12 is about the structure in FIG. 10. In each of FIGS. 11 and 12, the magnitude of the internal stress is denoted by different kinds of hatching. Values in the legends in FIGS. 11 and 12 are expressed in the unit Mpa. In FIGS. 11 and 12, the distortion generated in the electro-optical apparatus 100 is expressed by the deformation of a lattice. The results in FIGS. 11 and 12 have revealed that the distortion concentrates around the cutout 25a, and that the internal stress tends to be applied around the cutout 25a.

Figure 13:
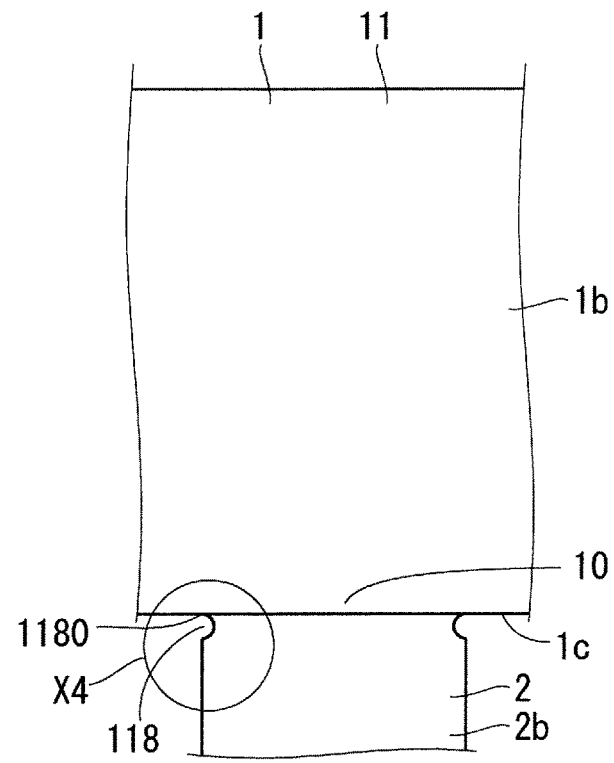
FIG. 13 is a plan view illustrating one example of the configuration of a first comparative apparatus.
Figure 14:
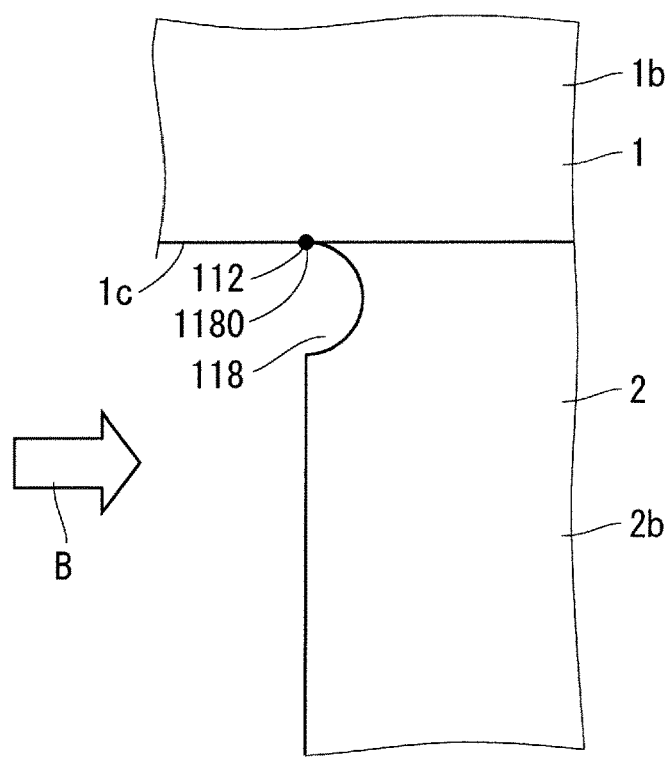
FIG. 14 is an enlarged view illustrating one example of the configuration of the first comparative apparatus.
Figure 15:
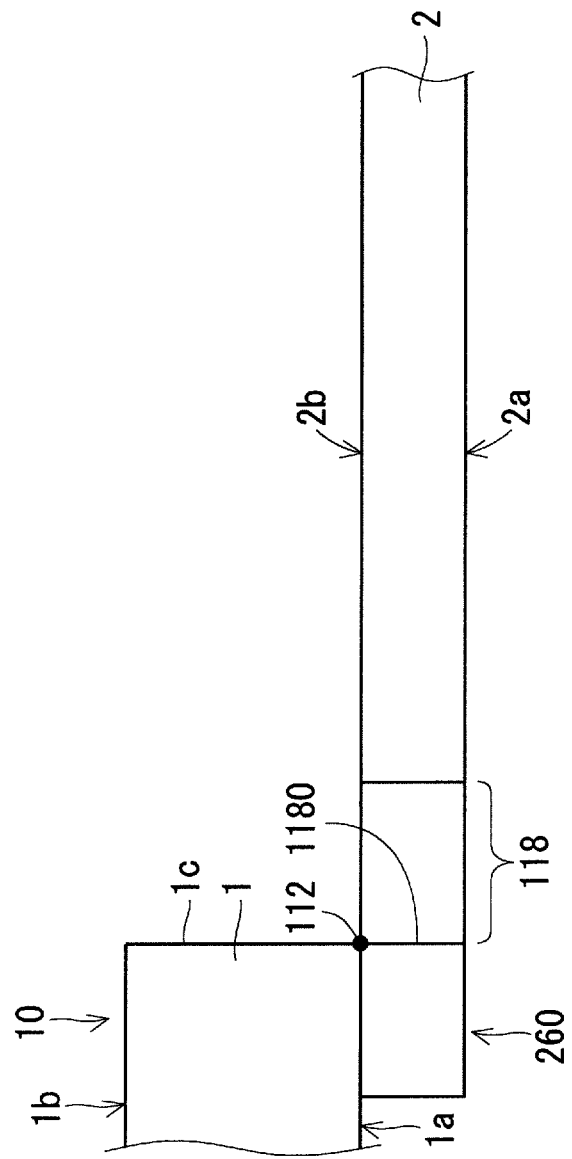
FIG. 15 is a side view illustrating one example of the configuration of the first comparative apparatus.
Figure 16:
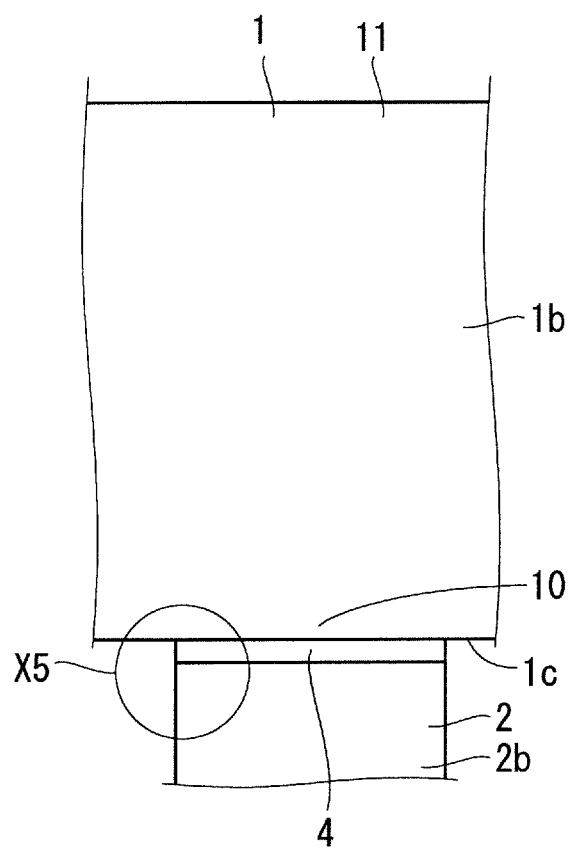
FIG. 16 is a plan view illustrating one example of the configuration of a second comparative apparatus.
Figure 17:
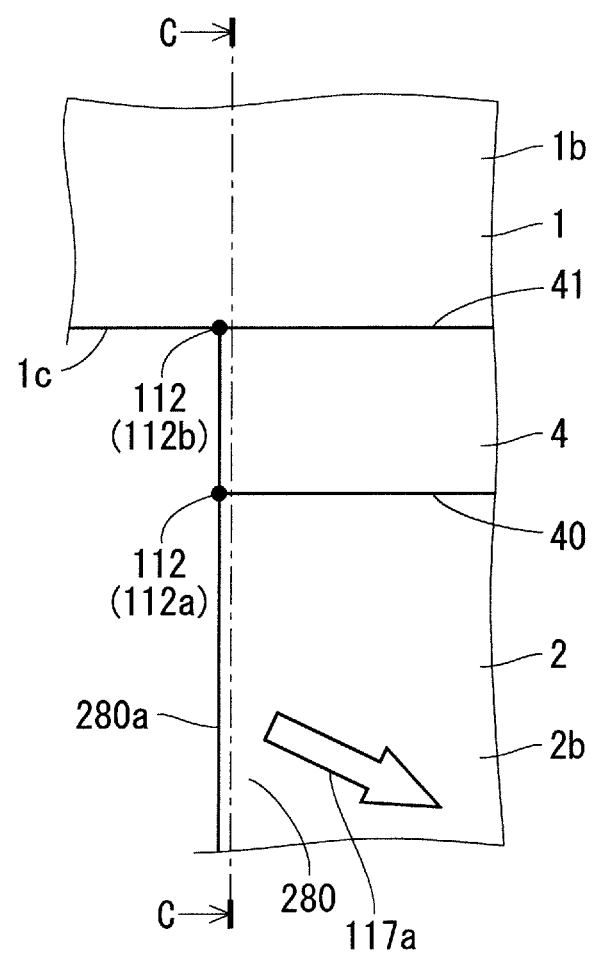
FIG. 17 is an enlarged view illustrating one example of the configuration of the second comparative apparatus.
Figure 18:
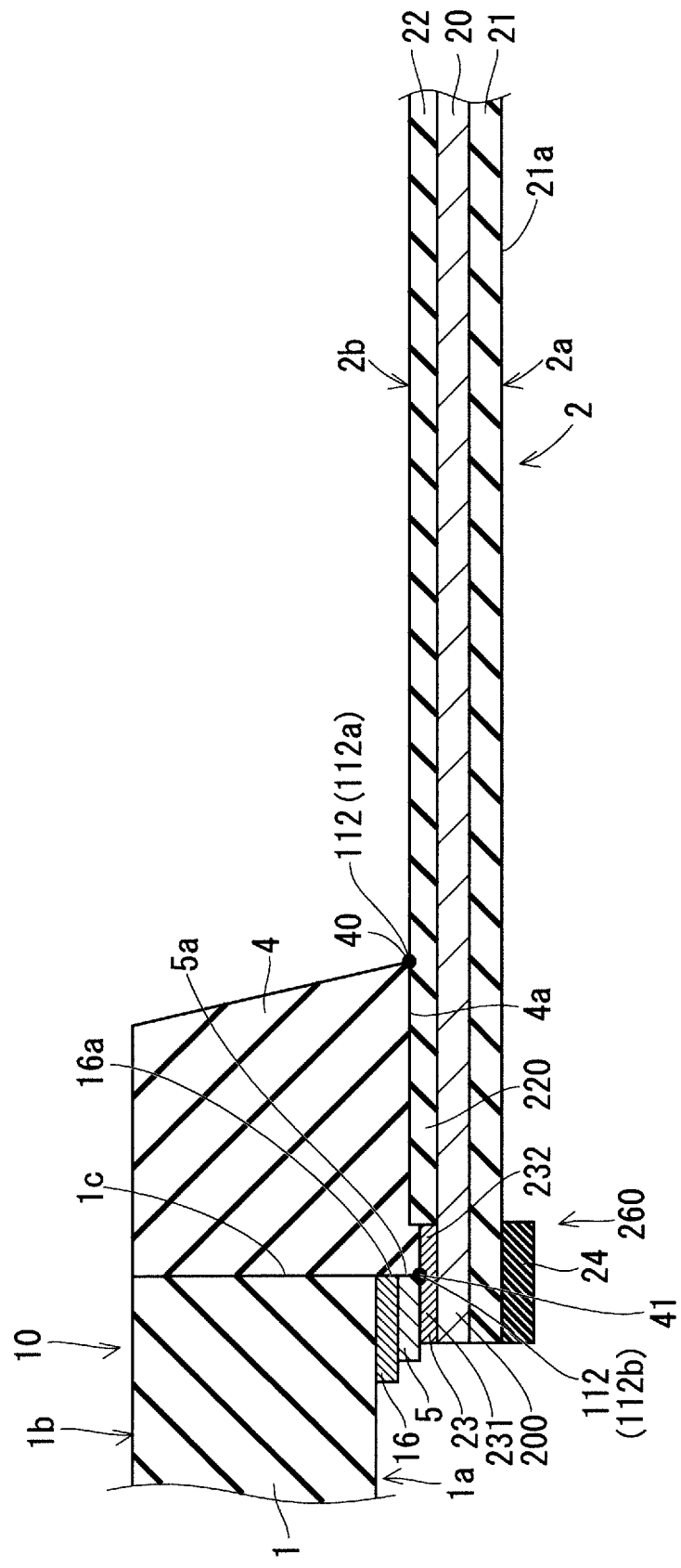
FIG. 18 is a cross-sectional view illustrating one example of the configuration of the second comparative apparatus.
Figure 19:
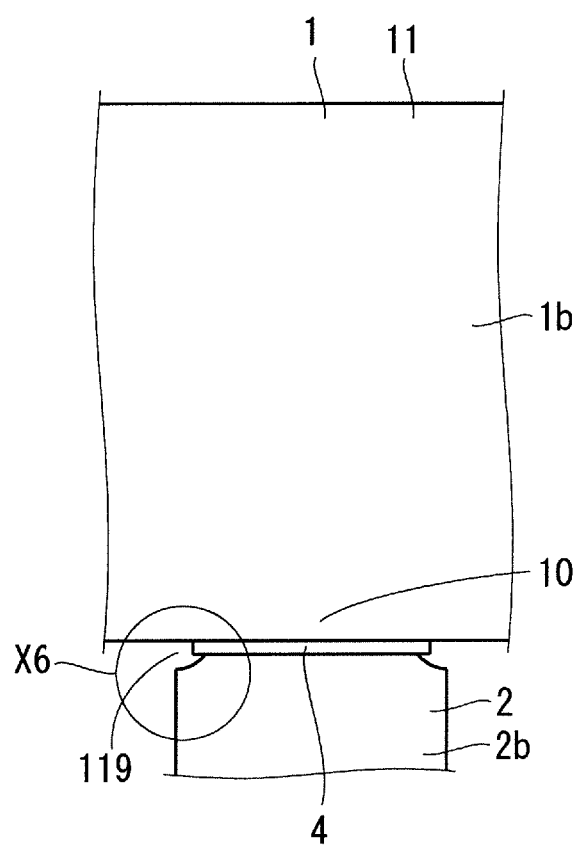
FIG. 19 is a plan view illustrating one example of the configuration of a third comparative apparatus.
Figure 20:
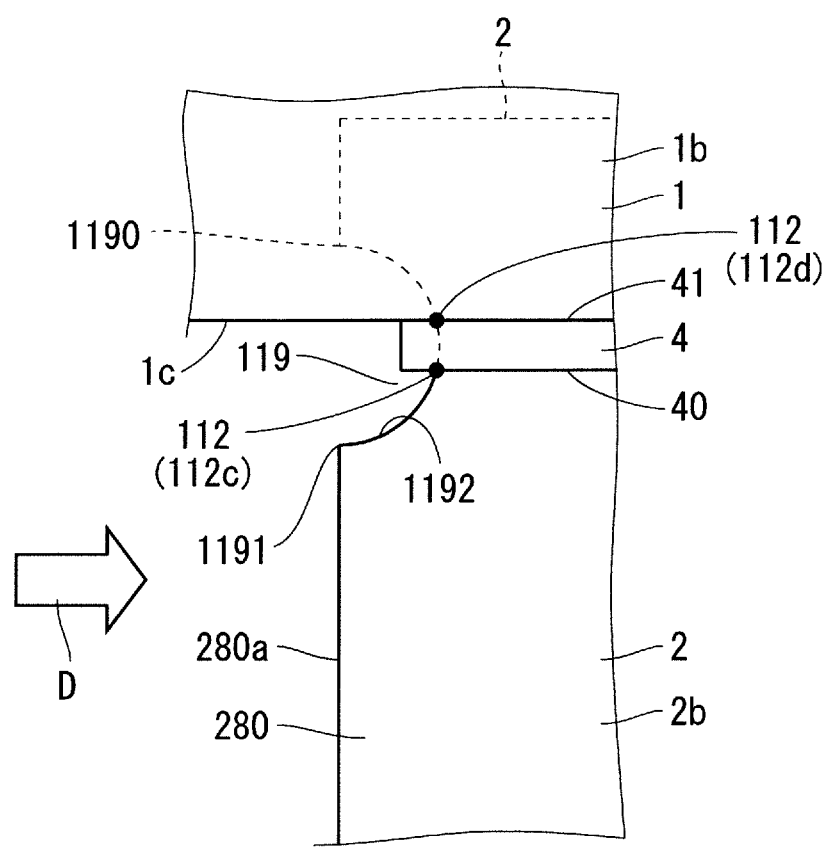
FIG. 20 is an enlarged view illustrating one example of the configuration of the third comparative apparatus.
Figure 21:
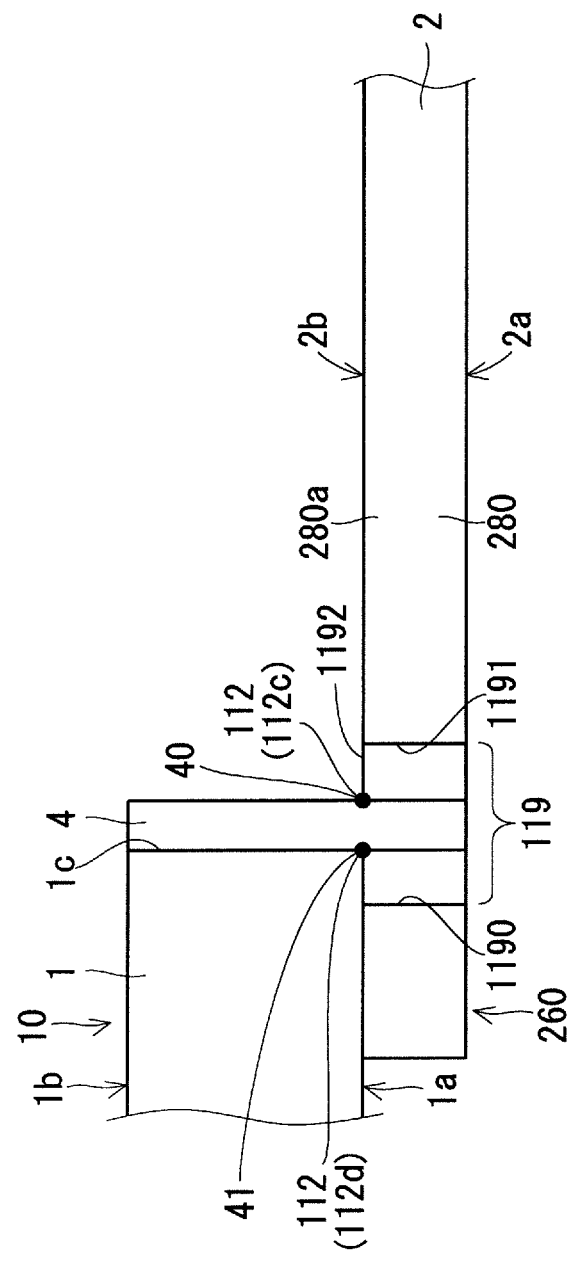
FIG. 21 is a side view illustrating one example of the configuration of the third comparative apparatus.

FIGS. 13 to 15 are diagrams each illustrating the structure of part of a first comparative apparatus for comparison with the electro-optical apparatus 100 according to the preferred embodiment. FIGS. 16 to 18 are diagrams each illustrating the structure of part of a second comparative apparatus for comparison with the electro-optical apparatus 100 according to the preferred embodiment. FIGS. 19 to 21 are diagrams each illustrating the structure of part of a third comparative apparatus for comparison with the electro-optical apparatus 100 according to the preferred embodiment.

The first comparative apparatus is different from the electro-optical apparatus 100 in that the first comparative apparatus includes no reinforcement members 4, as with the corresponding apparatus in Japanese Patent Application Laid-Open No. 2008-98548, and includes cutouts 118 instead of the cutouts 25a. The cutouts 118 have a shape similar to that of the cutouts 25a. FIG. 13 is a plan view illustrating the panel 1 and the connector 2 included in the first comparative apparatus. FIG. 14 is an enlarged view of a portion X4 in FIG. 13. FIG. 15 is a diagram illustrating the structure in FIG. 14 as viewed from arrow B. FIGS. 13 to 15 show the connector 2 that remains unbent.

In the first comparative apparatus, the cutout 118, when viewed from the back surface 2b, extends from the end surface 1c of the panel 1 in the length direction of the connector 2, as with a cutout (12a) in Japanese Patent Application Laid-Open No. 2008-98548. In the first comparative apparatus, the site 112, tending to exhibit stress concentration, is located at an end 1180 of the cutout 118 adjacent to the panel 1, as illustrated in FIGS. 14 and 15. The site 112, where stress concentration tends to occur, is thus located near the joint between the panel 1 and the connector 2. As a result, the joint between the connector 2 and the panel 1 can suffer damage. This possibly breaks the connector 2 or possibly causes the terminal electrode 23 of the connector 2 to detach from the panel 1. In addition, since the first comparative apparatus includes no reinforcement members 4, the first comparative apparatus under vibration or impact can suffer damage to or breakage in the connector 2 as bent. In the damaged connector 2, the conductor 20 (i.e., wire) is exposed in some cases, and the conductor 20, if directly affected by moisture and other things, can corrode to break.

The second comparative apparatus is different from the electro-optical apparatus 100 in that the second comparative apparatus includes no cutouts 25a, as with the corresponding apparatus in Japanese Patent Application Laid-Open No. 2007-292838. FIG. 16 is a plan view illustrating the panel 1, the connector 2, and the reinforcement member 4 included in the second first comparative apparatus. FIG. 17 is an enlarged view of a portion X5 in FIG. 16. FIG. 18 is a cross-sectional view taken along line C-C in the structure in FIG. 17. FIGS. 16 to 18 show the connector 2 that remains unbent.

FIGS. 17 and 18 each show the site 112 in the second comparative apparatus, where the stress 117a exerted on the connector 2 tends to concentrate when the force 115 (c.f., FIG. 6) is generated by friction, vibration, or other phenomena resulting from an external force. That is, stress concentration tends to occur at a site 112a, which is the boundary between the end surface 280a of the side edge 280 of the connector 2 and the end 40 of the connection surface 4a of the reinforcement member 4, the end 40 being adjacent to the board 3. In addition, stress concentration tends to occur at a site 112b, which is the boundary between the end surface 280a of the side edge 280 of the connector 2 and the end 41 of the connection surface 4a of the reinforcement member 4, the end 41 being adjacent to the panel 1. The site 112b is located near the joint between the panel 1 and the connector 2. Accordingly, the second comparative apparatus, as with the first comparative apparatus, can suffer damage to the joint between the panel 1 and the connector 2. As a result, the connector 2 possibly breaks, or the terminal electrode 23 of the connector 2 possibly detaches from the panel 1. Furthermore, in the second comparative apparatus, the connector 2, which has no cutouts at the side edges 280, is easily acted upon by an internal stress resulting from temperature changes.

The third comparative apparatus is different from the electro-optical apparatus 100 in that the third comparative apparatus includes, instead of the cutouts 25a, cutouts 119, which are similar to recesses (11) in Japanese Patent Application Laid-Open No. 2001-242479. FIG. 19 is a plan view illustrating the panel 1, the connector 2, and the reinforcement member 4 included in the third comparative apparatus. FIG. 20 is an enlarged view of a portion X6 in FIG. 19. FIG. 21 is a diagram illustrating the structure in FIG. 20 as viewed from arrow D. FIGS. 19 to 21 show the connector 2 that remains unbent.

When viewed from the back surface 2b, the cutout 119 in the third comparative apparatus extends, in the length direction of the connector 2, from a location closer to the end 11 than the end surface 1c of the panel 1, as with the recess (11) in Japanese Patent Application Laid-Open No. 2001-242479. That is, as illustrated in FIGS. 20 and 21, the cutout 119 has an end 1190 adjacent to the panel 1; the end 1190 is located closer to the end portion 10 of the panel 1 than the end surface 1c of the panel 1. The cutout 119 also has an end 1191 adjacent to the board 3. The end 1191 is located closer to the board 3 than the end 40 of the connection surface 4a of the reinforcement member 4, the end 40 being adjacent to the board 3. In the third comparative apparatus, the reinforcement member 4 extends also in the cutout 119.

As illustrated in FIGS. 20 and 21, the cutout 119 has an edge 1192 on the back surface 2b of the connector 2. The third comparative apparatus tends to exhibit stress concentration at a site 112c, which is the boundary between the edge 1192 and the end 40 of the connection surface 4a of the reinforcement member 4, the end 40 being adjacent to the board 3. In addition, the third comparative apparatus tends to exhibit stress concentration at a site 112d, which is the boundary between the edge 1192 of the cutout 119 and the end 41 of the connection surface 4a of the reinforcement member 4, the end 41 being adjacent to the panel 1. The site 112d is located near the joint between the panel 1 and the connector 2. Accordingly, the third comparative apparatus, as with the first and second comparative apparatuses, can suffer damage to the joint between the panel 1 and the connector 2. This possibly breaks the connector 2 or possibly causes the terminal electrode 23 of the connector 2 to detach from the panel 1.

The third comparative apparatus, on the other hand, can reduce possible breakage in the connector 2 by making the reinforcement member 4 hard. Such a hard reinforcement member 4 is unfortunately undesirable because it reduces flexibility necessary for bending the connector 2. In addition, if the reinforcement member 4 is not sufficiently formed in the cutout 119 in a process step, the connector 2 will probably break.

In comparison to the first to third comparative apparatuses, the electro-optical apparatus 100 according to the preferred embodiment has the cutouts 25a at the side edges 280 of the connectors 2. The end 250 at the edge 252 of each cutout 25a, the end 250 being adjacent to the panel 1, is located closer to the board 3 than the end 41 of the connection surface 4a of the reinforcement member 4, the end 41 being adjacent to the panel 1. The end 251 at the edge 252 of each cutout 25a, the end 251 being adjacent to the board 3, is located closer to the board 3 than the end 40 of the connection surface 4a of the reinforcement member 4, the end 40 being adjacent to the board 3. This allows the site 112, where an external or internal stress tends to concentrate, to be spaced from the joint between the connector 2 and the panel 1. Consequently, a stress reduces at the joint between the panel 1 and the connector 2. As a result, the connector 2 is less likely to suffer damage or breakage, or the connector 2 is less likely to detach from the panel 1. The conductor 20 is less likely to suffer exposure resulting from damage to the connector 2. Consequently, the conductor 20 is less likely to corrode or break. This improves the performance of the electro-optical apparatus 100.

In addition, a stress tends to act on the periphery of the cutout 25a. Consequently, the board-side end portion 270 of the connector 2 is less likely to detach from the board 3.

In addition, increasing the distance between the cutout 25a and the conductor 20 within the connector 2 enables the conductor 20 to be less affected by the stress applied around the cutout 25a. Consequently, the conductor 20 of the connector 2 is less likely to break.

In addition, providing the cutout 25a for each of the pair of side edges 280 of each connector 2, as with the forgoing example, further reduces the stress at the joint between the panel 1 and the connector 2. As a result, the connector 2 is further less likely to suffer damage or breakage, or the connector 2 is further less likely to detach from the panel 1.

Figure 22:
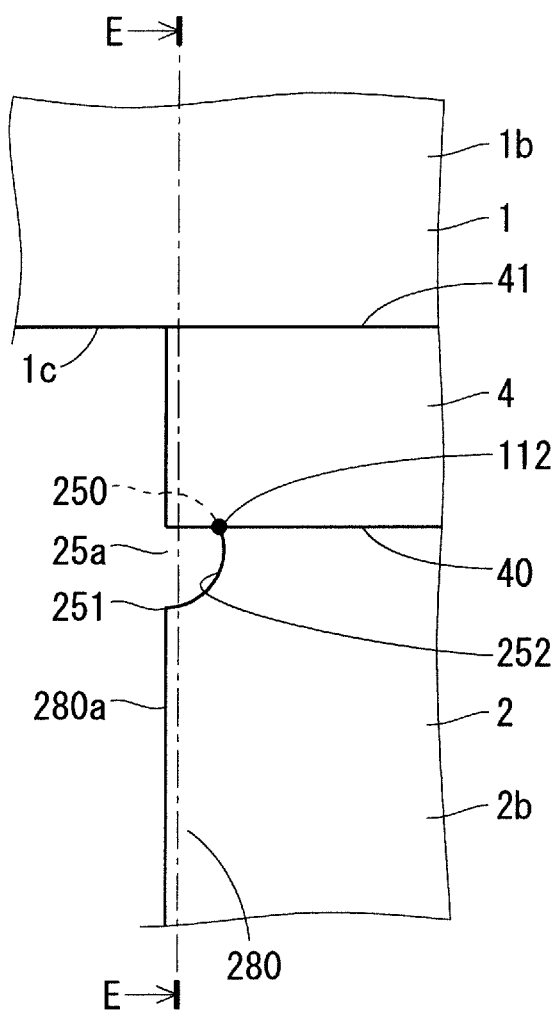
FIG. 22 is an enlarged view illustrating one example of the configuration of the electro-optical apparatus.
Figure 23:
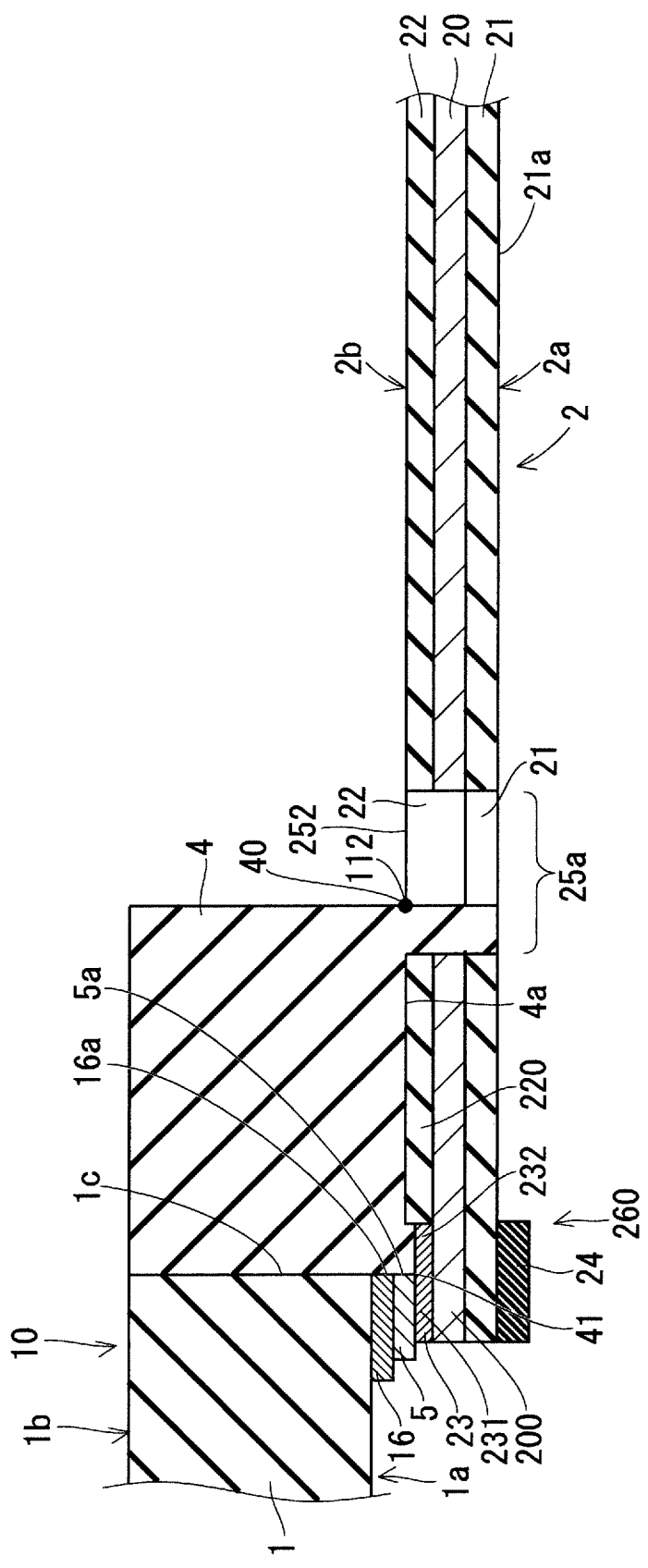
FIG. 23 is a cross-sectional view illustrating one example of the configuration of the electro-optical apparatus.

In the foregoing example, the end 250 at the edge 252 of the cutout 25a, the end 250 being adjacent to the panel 1, is not closer to the panel 1 than the end 40 of the connection surface 4a of the reinforcement member 4, the end 40 being adjacent to the board 3. The end 250 may be located closer to the panel 1 than the end 40. FIG. 22 is a plan view illustrating the panel 1, the connector 2, and the reinforcement member 4 in this case. FIG. 23 is a cross-sectional view taken along line E-E in the structure in FIG. 22. In the example in FIGS. 22 and 23, the reinforcement member 4 extends in the cutout 25a.

In some cases, the end 250 at the edge 252 of the cutout 25a, the end 250 being adjacent to the panel 1, is closer to the panel 1 than the end 40 of the connection surface 4a of the reinforcement member 4, the end 40 being adjacent to the board 3. In these cases, a stress tends to concentrate at the site 112, which is the boundary between the edge 252 of the cutout 25a and the end 40 of the reinforcement member 4, as illustrated in FIGS. 22 and 23. This allows the site 112, where the stress tends to concentrate, to be spaced from the joint between the connector 2 and the panel 1 even when the end 250 of the cutout 25a is located closer to the panel 1 than the end 40 of the reinforcement member 4. Consequently, a stress reduces at the joint between the panel 1 and the connector 2, as with the structure in FIGS. 1 to 6.

Figure 24:
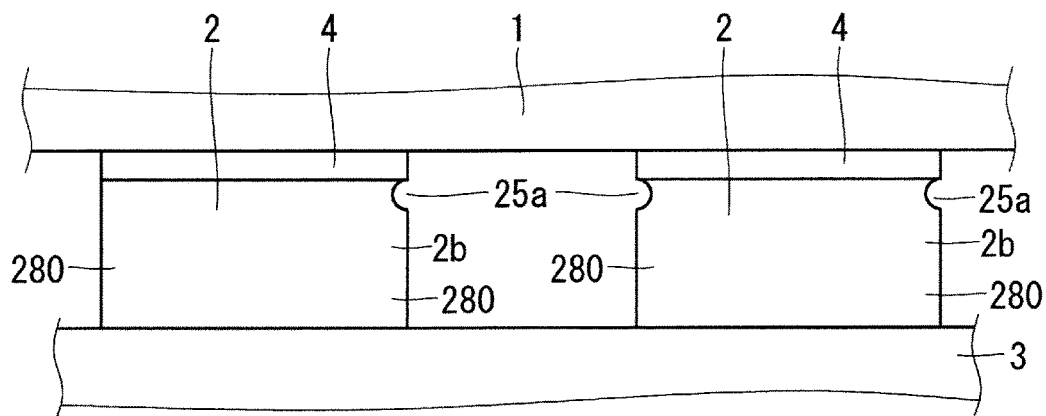
FIGS. 24 to 33 are plan views each illustrating one example of the configuration of the electro-optical device.

The cutout 25a, although disposed at each of the pair of side edges 280 of each connector 2 in the foregoing example, may be disposed one of the pair of side edges 280. FIG. 24 is a plan view illustrating one example of the panel 1, the connectors 2, and the reinforcement members 4 in this case. In the example in FIG. 24, one of the two connectors 2 has the cutout 25a at only the side edge 280 adjacent to the other connector 2. The other connector 2 has the cutout 25a at each of the pair of side edges 280. The other connector 2 may have the cutout 25a at only one of the side edges 280.

Figure 25:
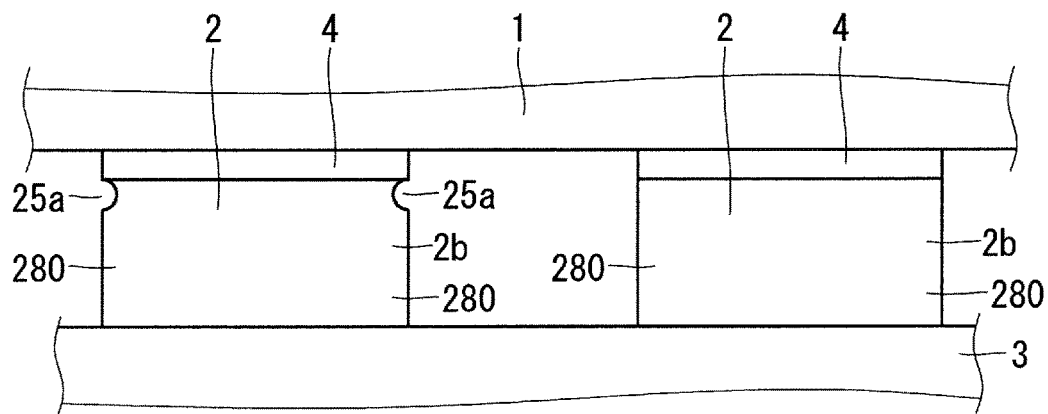

The cutout 25a, although disposed in each of the plurality of connectors 2 in the foregoing example, may be disposed in only some of the connectors 2. FIG. 25 is a plan view illustrating one example of the panel 1, the connectors 2, and the reinforcement members 4 in this case. In the example in FIG. 25, only one of the two connectors 2 has the cutouts 25a.

Figure 26:
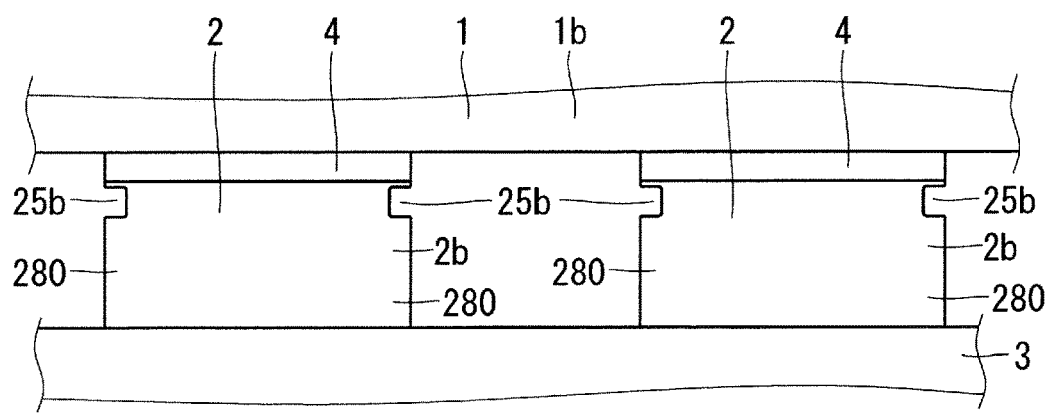
Figure 27:
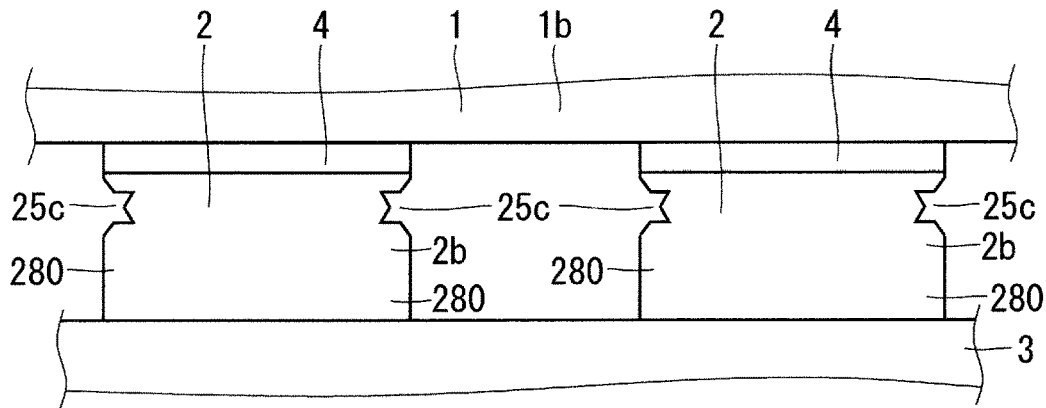

Each connector 2, although having semicircular cutouts, may have cutouts in any form. For instance, the connector 2 may have a polygonal cutout. FIGS. 26 and 27 are plan views each illustrating one example of the panel 1, the connectors 2, and the reinforcement members 4 in this case. The connectors 2 in FIG. 26 each have quadrangular cutouts 25b instead of the cutouts 25a. The connectors 2 in FIG. 27 each have half-pentagram cutouts 25c instead of the cutouts 25a. The cutouts 25b in FIG. 26 are quadrangular when viewed from the front surface 2a or the back surface 2b. The cutouts 25c in FIG. 27 have a half-pentagram shape when viewed from the front surface 2a or the back surface 2b. It is noted that the connectors 2 each may have cutouts having another polygonal shape, such as a triangular shape or a pentagonal shape. As illustrated in FIGS. 26 and 27, in some cases, the end at the edge of the cutout on the back surface 2b, the end being adjacent to the panel 1, is not located closer to the panel 1 than the end of the reinforcement member 4 of the connection surface that is in contact with the back surface 2b, the end being adjacent to the board 3. The innermost position of such a cutout is the site 112, where a stress tends to concentrate.

Figure 28:
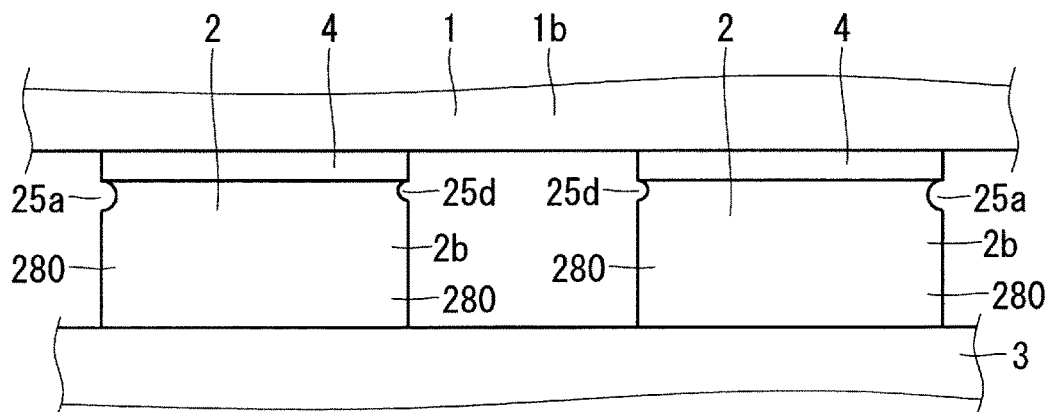
Figure 29:
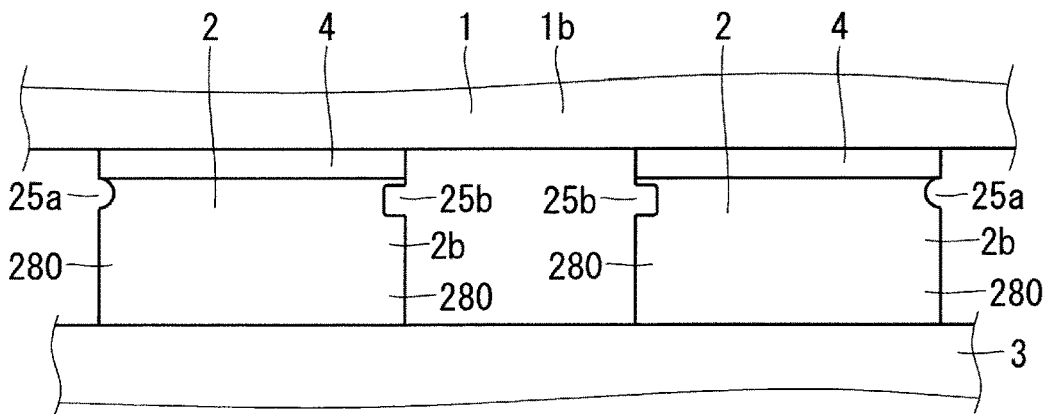

It is also noted that the cutout at one of the side edges 280 of the connector 2 may have a shape different from that of the cutout at the other side edge 280. FIGS. 28 and 29 are plan views each illustrating one example of the panel 1, the connectors 2, and the reinforcement members 4 in this case. In the example in FIG. 28, one of the connectors 2 has a semicircular cutout 25d smaller than the cutout 25a in diameter, at the side edge 280 adjacent to the other connector 2. In addition, the other connector 2 has the cutout 25d at the side edge 280 adjacent to the one of the connectors 2. In the example in FIG. 29, one of the connectors 2 has the cutout 25*b* at the side edge 280 adjacent to the other connector 2. In addition, the other connector 2 has the cutout 25*b* at the side edge 280 adjacent to the one of the connectors 2.

Figure 30:
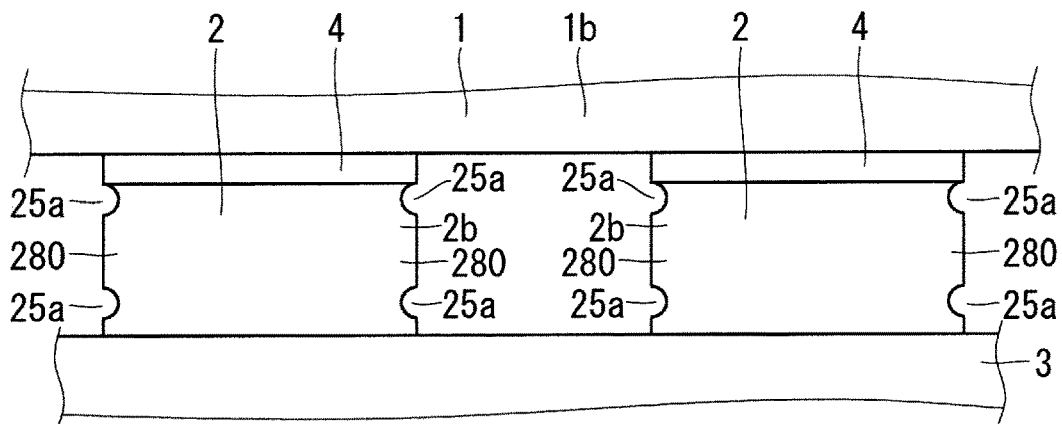

The connectors 2 each may have a plurality of cutouts at each side edge 280. FIG. 30 is a plan view illustrating one example of the panel 1, the connectors 2, and the reinforcement members 4 in this case. In the example in FIG. 30, each connector 2 has two cutouts 25*a* at each of the pair of side edges 280. The side edges 280 each may be provided with three or more cutouts.

Figure 31:
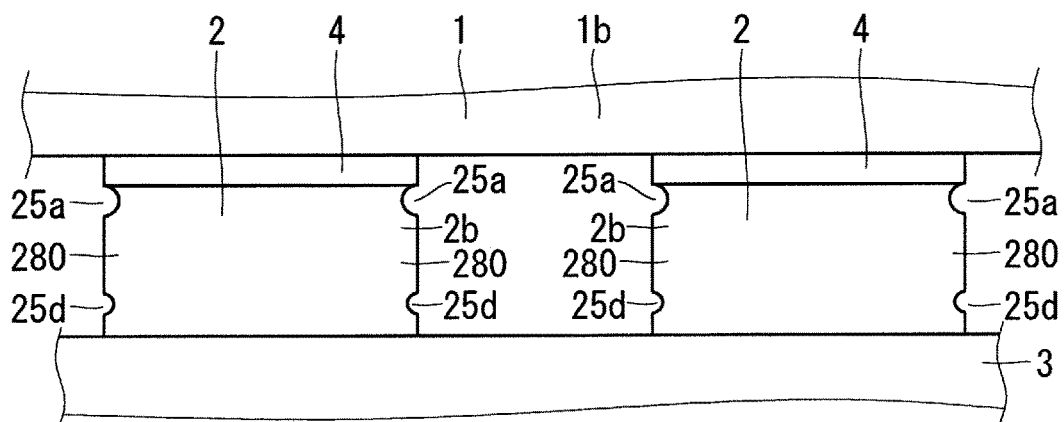

When the connector 2 has a plurality of cutouts at the side edge 280, these cutouts may have different shapes from each other. FIG. 31 is a plan view illustrating one example of the panel 1, the connectors 2, and the reinforcement members 4 in this case. In the example in FIG. 31, each side edge 280 is provided with the cutouts 25*a* and 25*d* having different shapes from each other.

As described above, the side edges 280 are each provided with a plurality of cutouts. This increases the number of sites 112, where a stress tends to concentrate. A stress generated in the electro-optical apparatus 100 is consequently distributed. This further reduces possible damage to the connectors 2 or possible breakage in the connectors 2.

When the electro-optical apparatus 100 includes a plurality of connectors 2, a cutout may be disposed at the outer side edge 280 of the farthest connector 2. In other words, a cutout may be disposed at the outer side edge 280 of at least one of the connectors 2 at both ends among the plurality of connectors 2.

Figure 32:
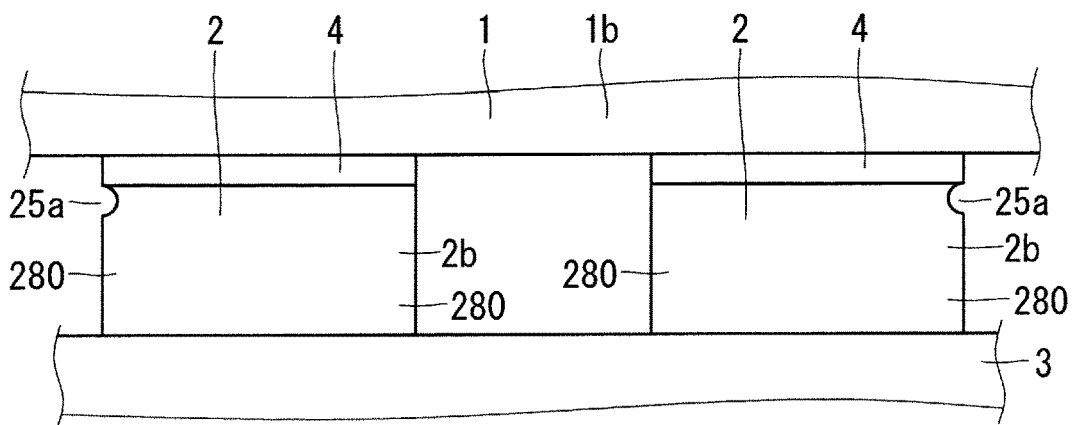

In the electro-optical apparatus 100 that includes two connectors 2, as illustrated in FIG. 1 and other drawings, each of the two connectors 2 is the farthest connector 2. In the examples in FIGS. 1 and 26 to 31, where the electro-optical apparatus 100 includes two connectors 2, at least one cutout is disposed at the outer side edge 280 of each of the two connectors 2. In the examples in FIGS. 24 and 25, where the electro-optical apparatus 100 includes two connectors 2, a cutout is disposed at the outer side edge 280 of only one of the two connectors 2. FIG. 32 illustrates an example where the electro-optical apparatus 10 includes two connectors 2 each having the cutout 25*a* at only the outer one of the pair of side edges 280.

Figure 33:
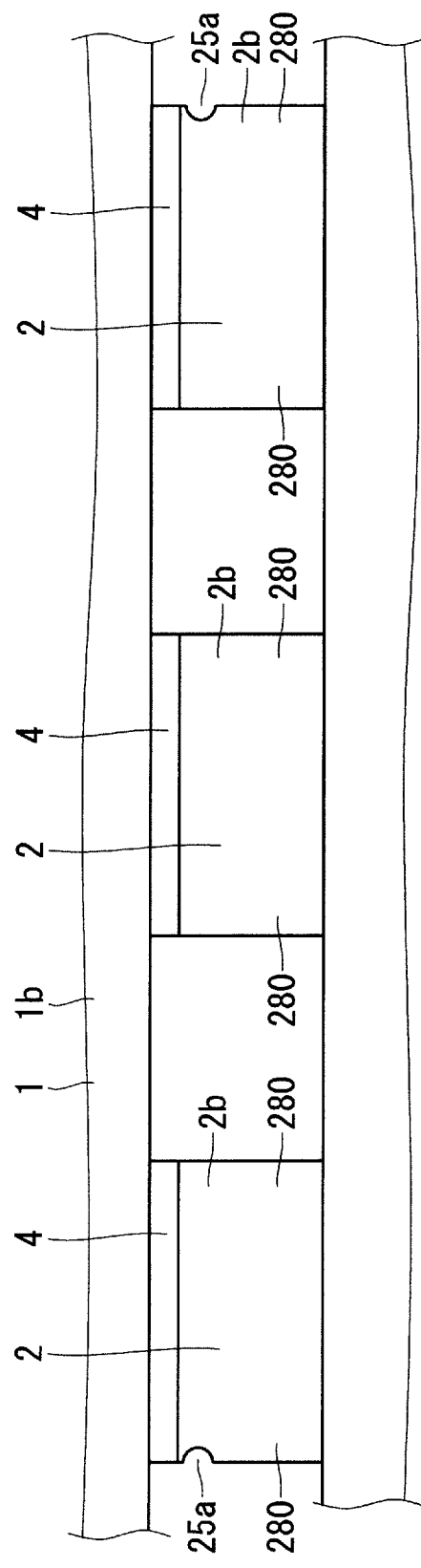

FIG. 33 illustrates an example where the electro-optical apparatus 10 includes three connectors 2, two of which at both ends each have the cutout 25*a* at only the outer one of the pair of side edges 280. It is noted that in the example in FIG. 33, only one of the connectors 2 at both ends may have a cutout at the outer side edge 280. It is also noted that in the example in FIG. 33, at least one of the connectors 2 at both ends may have a cutout at each of the pair of side edges 280. It is also noted that in the example in FIG. 33, the connector 2 in the middle may have a cutout at at least one of the pair of side edges 280.

In the electro-optical apparatus 100 that includes a plurality of connectors 2, the farthest connector 2 tends to be under stress at the outer side edge 280. Providing a cutout at such an outer side edge 280 reduces, with more certainty, possible damage to the farthest connector 2 or possible breakage in the farthest connector 2.

In some cases, the connectors 2 at both ends among a plurality of connectors 2 each have a cutout at only the outer side edge 280, as shown in the example in FIGS. 32 and 33. Such a configuration improves the flexibility in designing the circuit of the connector 2 or the flexibility in designing the outer shape of the connector 2. Furthermore, such a configuration needs fewer cutouts, thereby reducing manufacturing costs for forming the cutouts.

Second Preferred Embodiment

Figure 34:
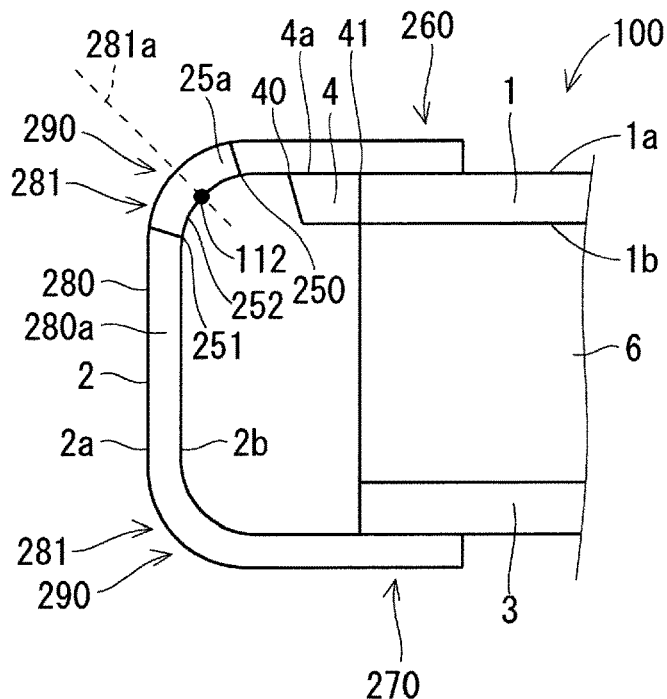
FIG. 34 is a side view illustrating one example of the configuration of the electro-optical apparatus.
Figure 35:
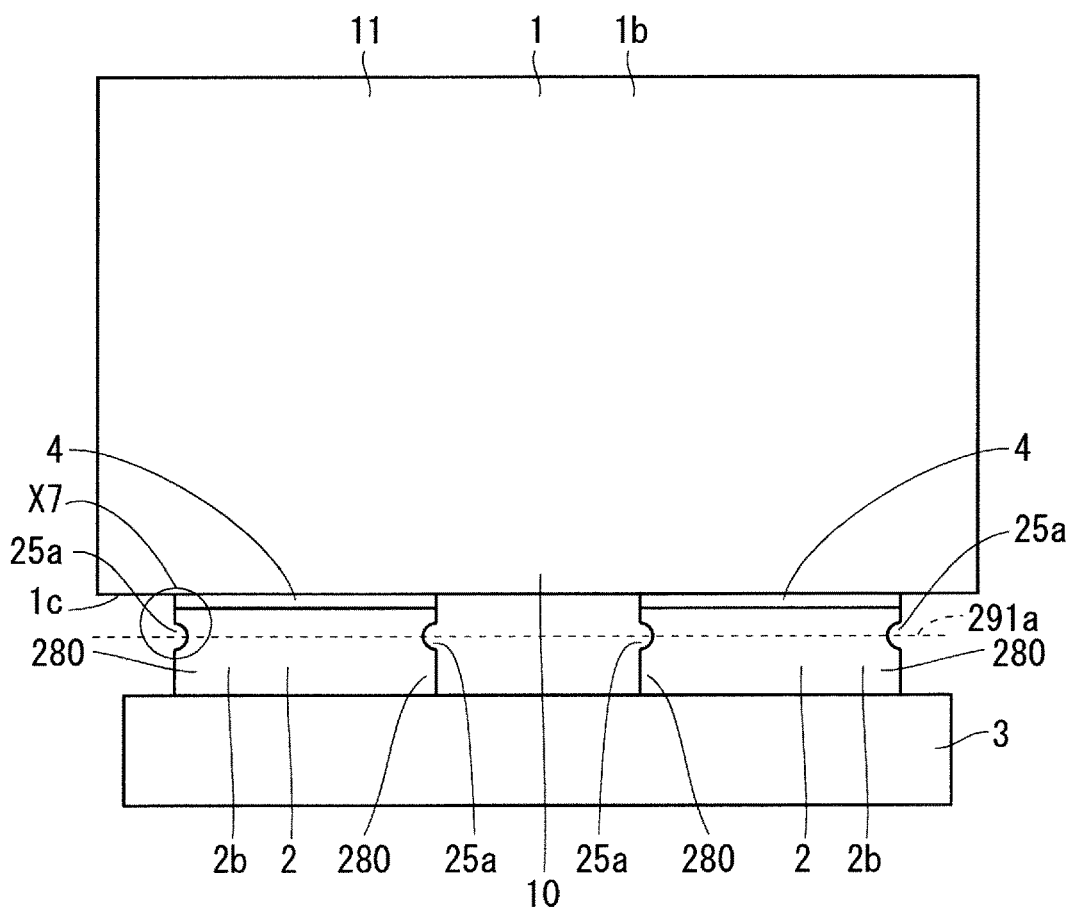
FIG. 35 is a plan view illustrating one example of the configuration of the electro-optical apparatus.
Figure 36:
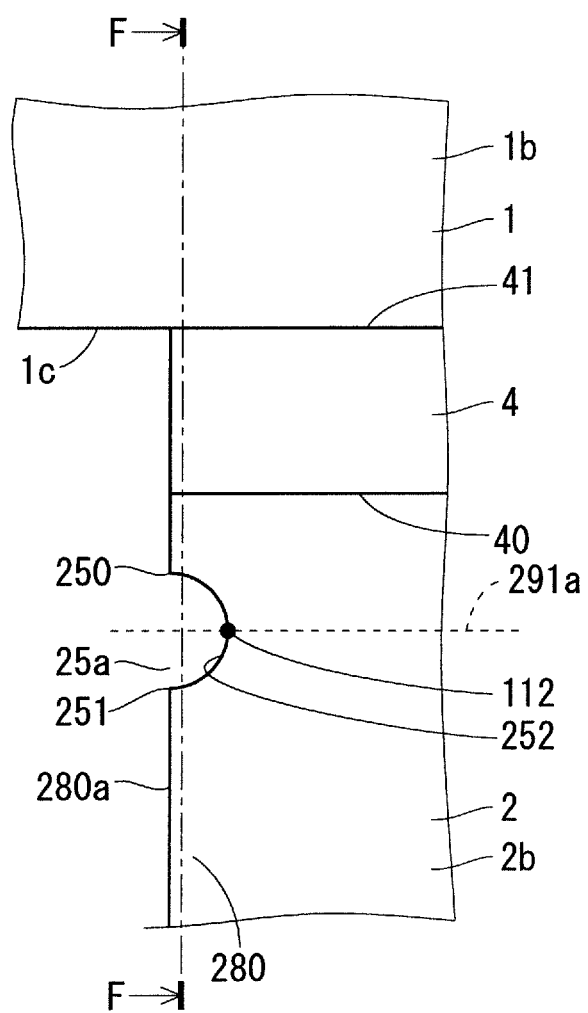
FIG. 36 is an enlarged view illustrating one example of the configuration of the electro-optical apparatus.
Figure 37:
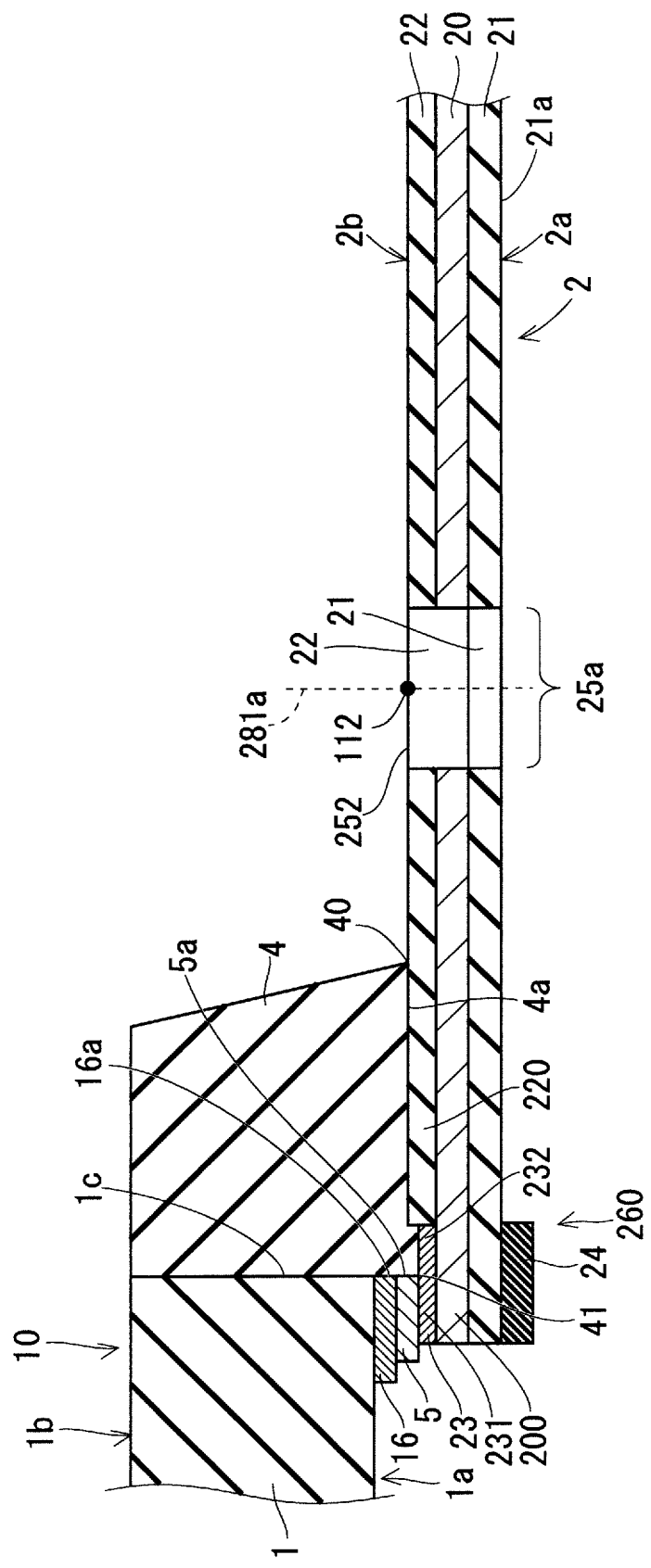
FIG. 37 is a cross-sectional view illustrating one example of the configuration of the electro-optical apparatus.

FIG. 34 is a side view illustrating one example of the configuration of the electro-optical apparatus 100 according to a second preferred embodiment. FIG. 35 is a side view illustrating one example of the configuration of the panel 1, the connectors 2, the board 3, and the reinforcement members 4, all of which are included in the electro-optical apparatus 100 according to the preferred embodiment. FIG. 36 is an enlarged view of a portion X7 in FIG. 35. FIG. 37 is a cross-sectional view taken along line F-F in the structure in FIG. 36. FIGS. 35 to 37 show the connector 2 before bent.

In the first preferred embodiment, the connector 2 is curved with the panel 1 and the board 3 attached to the backlight 6. In the second preferred embodiment by contrast, the connector 2 is bent with the panel 1 and the board 3 attached to the backlight 6.

In the example in FIG. 34, the connector 2, which is bent at two sites, has two bent portions 290. One of the bent portions 290 is located near the panel-side end portion 260, and the other bent portion 290 is located near the board-side end portion 270. With the two bent portions 290, the connector 2 has two corner portions 281 at the side edge 280, as illustrated in FIG. 34. The corner portions 281 are also considered to be bent portions at the side edge 280.

A dashed line 291*a* in each of FIGS. 35 and 36 denotes the centerline of the bent portion 290 that extends in the width direction of the connector 2 when viewed from the back surface 2*b*, the bent portion 290 being located near the panel-side end portion 260 of the connector 2. The dashed line 291*a* is hereinafter also referred to as a centerline 291*a*

In the preferred embodiment, the cutout 25*a* is disposed at the corner portion 281 of the side edge 280. To be specific, the cutout 25*a* is disposed at only one of the two corner portions 281 of the side edge 280, the corner portion 281 being adjacent to the panel 1. In the preferred embodiment, as illustrated in FIG. 34, the cutout 25*a* is disposed at the corner portion 281 in such a manner that a bisector 281*a* of the corner portion 281 is superposed on the site 112 when viewed from the end surface 280*a* of the side edge 280. As described above, the site 112 in is the innermost position of the edge 252 of the cutout 25*a* on the back surface 2*b*. That is, the cutout 25*a* is disposed at the corner portion 281 in such a manner the bisector 281*a* of the corner portion 281 is superposed on the innermost position of the edge 252 of the cutout 25*a* when viewed from the end surface 280*a*. As illustrated in FIG. 36, the cutout 25*a* is disposed at the bent portion 290 in such a manner the centerline 291*a* of the bent portion 290 is superposed on the site 112 when viewed from the back surface 2*b*.

As described above, the cutout 25*a* is disposed at the corner portion 281 formed at the side edge 280 by bending the connector 2. Since the corner (i.e., bent portion) 281 tends to be under stress, providing the cutout 25*a* at the corner portion 281 reduces possible damage to the connector 2 or breakage in the connector 2.

As shown in the example in FIG. 34, the cutout 25*a* is disposed at the corner portion 281 in such a manner the bisector 281*a* of the corner portion 281 is superposed on the site 112 when viewed from the end surface 280*a* of the side edge 280. Accordingly, the site 112 tends to further exhibit stress concentration. This reduces possible damage to the connector 2 or possible breakage in the connector 2.

Figure 38:
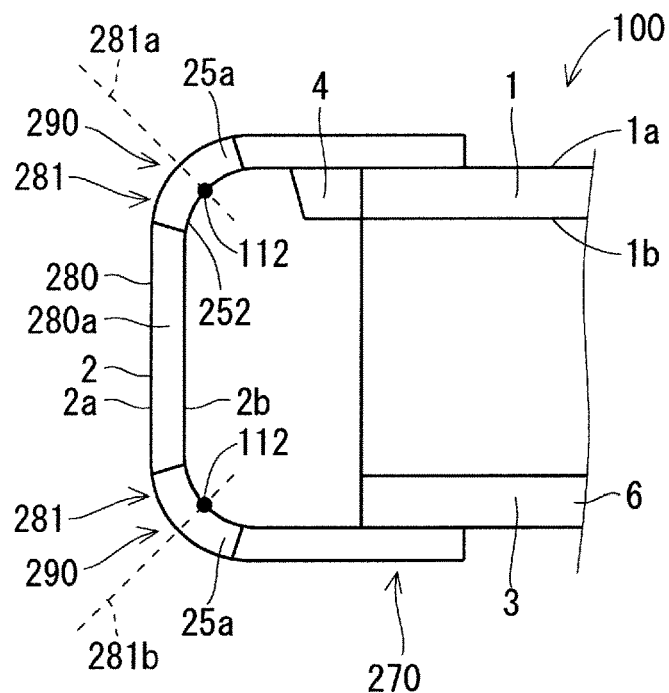
FIG. 38 is a side view illustrating one example of the configuration of the electro-optical apparatus.
Figure 39:
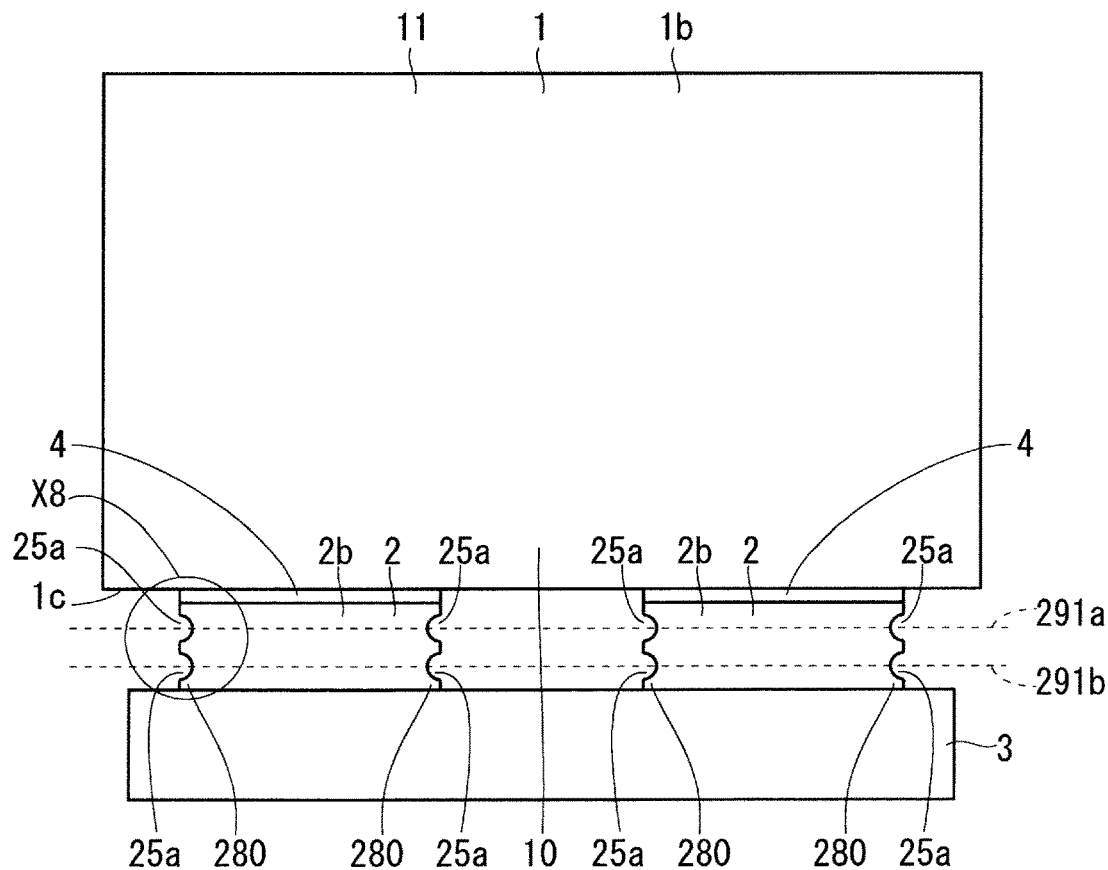
FIG. 39 is a plan view illustrating one example of the configuration of the electro-optical apparatus.
Figure 40:
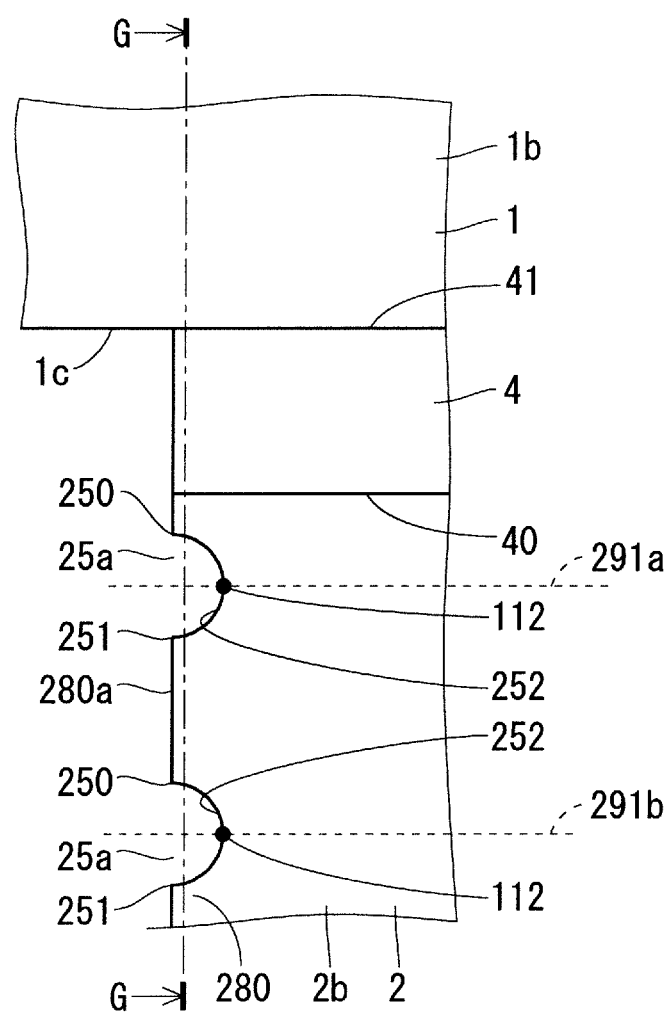
FIG. 40 is an enlarged view illustrating one example of the configuration of the electro-optical apparatus.
Figure 41:
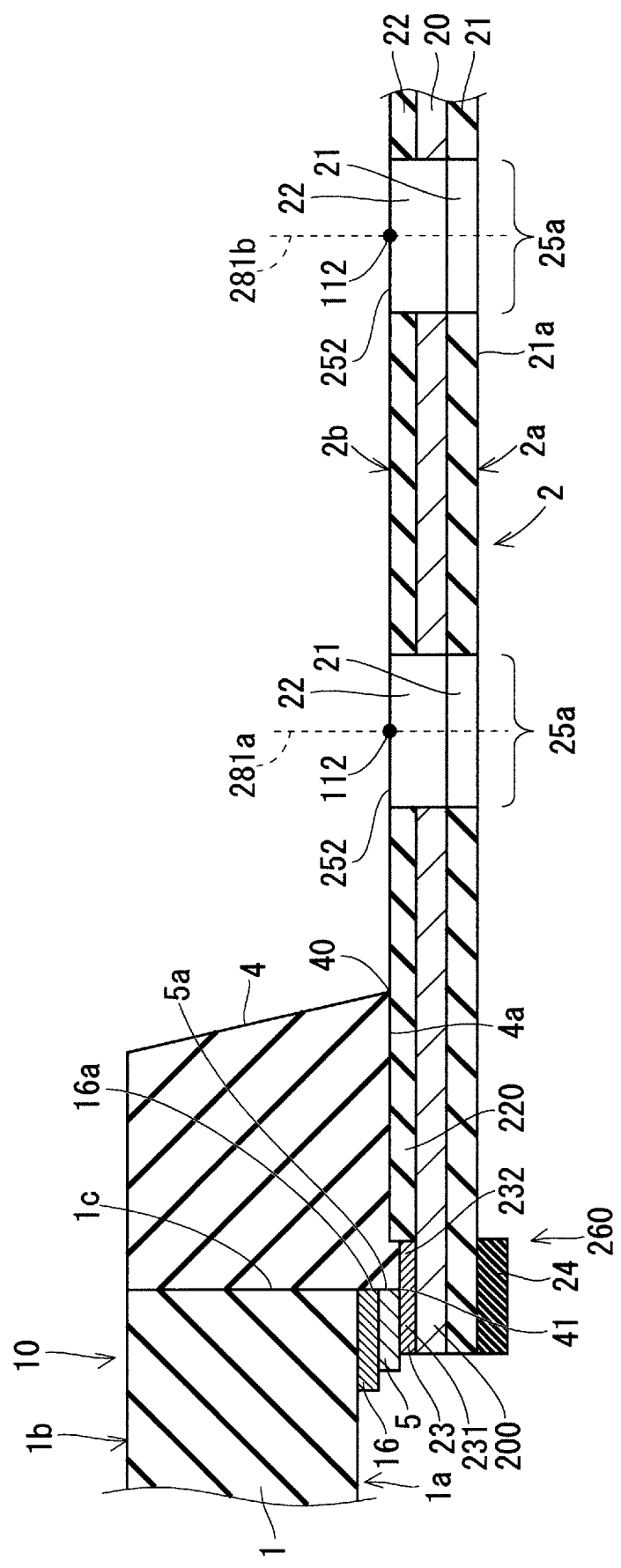
FIG. 41 is a cross-sectional view illustrating one example of the configuration of the electro-optical apparatus.

The cutout 25*a* may be disposed at each of the two corner portions 281 at the side edge 280 of the connector 2. FIG. 38 is a side view illustrating one example of the configuration of the electro-optical apparatus 100 in this case. FIG. 39 is a plan view illustrating one example of the configuration of the panel 1, the connectors 2, the board 3, and the reinforcement members 4, all of which are included in the electro-optical apparatus 100 in FIG. 38. FIG. 40 is an enlarged view of a portion X8 in FIG. 39. FIG. 41 is a cross-sectional view taken along line G-G in the structure in FIG. 40. FIGS. 39 to 41 show the connector 2 before bent. A dashed line 291b in each of FIGS. 39 and 40 denotes the centerline of the bent portion 290 that extends in the width direction of the connector 2 when viewed from the back surface 2b, the bent portion 290 being located near the board-side end portion 270 of the connector 2.

In the electro-optical apparatus 100 that includes a plurality of connectors 2, the farthest connector 2 may have a cutout at the corner portion 281 of the outer side edge 280. FIG. 42 is a diagram illustrating one example of the connectors 2 in this case. FIG. 42 shows the connector 2 that remains unbent. In the example in FIG. 42, the farthest connector 2 has the cutout 25a at each of the two corner portions 281 of the outer side edge 280.

When the two corner portions 281 of the side edge 280 are individually provided with cutouts, the cutout at one of the corner portions 281 may have a shape different from that of the cutout at the other corner portion 281. FIG. 43 is a diagram illustrating one example of the connectors 2 in this case. FIG. 43 shows the connector 2 that remains unbent. In the example in FIG. 43, one of the two corner portions 281 of the side edge 280 is provided with the cutout 25a, the corner portion 281 being adjacent to the panel 1; in addition, the other corner portion 281 adjacent to the board 3 is provided with the cutout 25d smaller than the cutout 25a in diameter.

It is noted that in the present invention, the individual preferred embodiments can be freely combined, or can be modified and omitted as appropriate, within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. An electro-optical apparatus comprising:
   an electro-optical panel comprising a panel end portion; and
   a first connector that is flexible, the first connector comprising a first end portion and a second end portion opposite to the first end portion, the first end portion being connected to the panel end portion and the second end portion being connected to a circuit board,
   wherein the first connector comprises a first surface connected to the panel end portion of the electro-optical panel, and a second surface opposite to the first surface,
   wherein a conductive adhesive to connect the first surface and the panel end portion of the electro-optical panel to each other is located between the first surface and the panel end portion of the electro-optical panel,
   wherein the first connector comprises first and second side edges, the first side edge comprising a first cutout and the second side edge comprising a second cutout, each cutout depressed inward in plan view, the first and second side edges extending between the panel end portion and the circuit board,
   wherein the first side edge has a first portion between the panel end portion and the first cutout, and a second portion between the first cutout and the circuit board,
   wherein the second side edge has a third portion between the panel end portion and the second cutout, and a fourth portion between the second cutout and the circuit board, and
   wherein a minimum distance between a conductor in the first connector closest to an innermost edge of the first cutout in plan view and the innermost edge of the first cutout nearest to the conductor in plan view is larger than a minimum distance between the conductor and the first side edge of the first connector in plan view where there is not a cutout.

2. The electro-optical apparatus of claim 1, wherein the conductor in the first connector closest to the innermost edge of the first cutout in plan view is bent towards the center of the first connector in plan view to avoid the first cutout.

3. The electro-optical apparatus of claim 1, wherein the first cutout and the second cutout are different shapes in plan view.

4. The electro-optical apparatus of claim 2, wherein the first cutout and the second cutout are different shapes in plan view.

5. The electro-optical apparatus of claim 1, wherein the first and third portions of the respective first and second side edges of the first connector are shorter than the second and fourth portions of the respective first and second side edges of the first connector.

6. The electro-optical apparatus of claim 2, wherein the first and third portions of the respective first and second side edges of the first connector are shorter than the second and fourth portions of the respective first and second side edges of the first connector.

7. The electro-optical apparatus of claim 3, wherein the first and third portions of the respective first and second side edges of the first connector are shorter than the second and fourth portions of the respective first and second side edges of the first connector.

8. An electro-optical apparatus comprising:
   an electro-optical panel comprising a panel end portion; and
   a first connector that is flexible, the first connector comprising a first end portion and a second end portion opposite to the first end portion, the first end portion being connected to the panel end portion and the second end portion being connected to a circuit board,
   wherein the first connector comprises a first surface connected to the panel end portion of the electro-optical panel, and a second surface opposite to the first surface,
   wherein a conductive adhesive to connect the first surface and the panel end portion of the electro-optical panel to each other is located between the first surface and the panel end portion of the electro-optical panel,
   wherein the first connector comprises first and second side edges, the first side edge comprising a first cutout and the second side edge comprising a second cutout, each cutout depressed inward in plan view, the first and second side edges extending between the panel end portion and the circuit board,
   wherein the first side edge has a first portion between the panel end portion and the first cutout, and a second portion between the first cutout and the circuit board,
   wherein the second side edge has a third portion between the panel end portion and the second cutout, and a fourth portion between the second cutout and the circuit board, and
   wherein the conductor in the first connector closest to the first cutout in plan view is bent towards the center of the first connector in plan view to avoid the first cutout.

9. The electro-optical apparatus of claim 8, wherein the first and third portions of the respective first and second side edges of the first connector are shorter than the second and fourth portions of the respective first and second side edges of the first connector.

10. The electro-optical apparatus of claim 8, wherein the first cutout and the second cutout are different shapes in plan view.

11. The electro-optical apparatus of claim 9, wherein the first cutout and the second cutout are different shapes in plan view.

12. An electro-optical apparatus comprising:
an electro-optical panel comprising a panel end portion; and
a first connector that is flexible, the first connector comprising a first end portion and a second end portion opposite to the first end portion, the first end portion being connected to the panel end portion and the second end portion being connected to a circuit board,
wherein the first connector comprises a first surface connected to the panel end portion of the electro-optical panel, and a second surface opposite to the first surface,
wherein a conductive adhesive to connect the first surface and the panel end portion of the electro-optical panel to each other is located between the first surface and the panel end portion of the electro-optical panel,
wherein the first connector comprises first and second side edges, the first side edge comprising a first cutout and the second side edge comprising a second cutout, each cutout depressed inward in plan view, the first and second side edges extending between the panel end portion and the circuit board,
wherein the first side edge has a first portion between the panel end portion and the first cutout, and a second portion between the first cutout and the circuit board,
wherein the second side edge has a third portion between the panel end portion and the second cutout, and a fourth portion between the second cutout and the circuit board, and
wherein the first and third portions of the respective first and second side edges of the first connector are shorter than the second and fourth portions of the respective first and second side edges of the first connector.

13. The electro-optical apparatus of claim 12, wherein the conductor in the first connector closest to the first cutout in plan view is bent towards the center of the first connector in plan view to avoid the first cutout.

14. The electro-optical apparatus of claim 12, wherein the first cutout and the second cutout are different shapes in plan view.

15. The electro-optical apparatus of claim 13, wherein the first cutout and the second cutout are different shapes in plan view.

* * * * *